(12) United States Patent
Sarver et al.

(10) Patent No.: US 10,723,160 B2
(45) Date of Patent: Jul. 28, 2020

(54) CARBIDE, NITRIDE AND SILICIDE ENHANCERS FOR LASER ABSORPTION

(71) Applicant: Ferro Corporation, Mayfield Heights, OH (US)

(72) Inventors: Joseph E. Sarver, Washington, PA (US); Nicholas M. Karpa, Pittsburgh, PA (US); Dennis R. Gilmore, Washington, PA (US); George E. Sakoske, Independence, OH (US)

(73) Assignee: Ferro Corporation, Mayfield Heights, OH (US)

( * ) Notice: Subject to any disclaimer, the term of this patent is extended or adjusted under 35 U.S.C. 154(b) by 88 days.

(21) Appl. No.: 15/877,427

(22) Filed: Jan. 23, 2018

(65) Prior Publication Data
US 2019/0225000 A1    Jul. 25, 2019

(51) Int. Cl.
| | |
|---|---|
| *B41M 5/26* | (2006.01) |
| *G03F 7/004* | (2006.01) |
| *C01B 33/06* | (2006.01) |
| *C01B 32/90* | (2017.01) |
| *C01B 32/956* | (2017.01) |
| *C01B 32/935* | (2017.01) |
| *C01B 32/942* | (2017.01) |
| *C01B 32/914* | (2017.01) |
| *C01B 21/06* | (2006.01) |
| *C01G 39/00* | (2006.01) |
| *C09C 1/34* | (2006.01) |
| *C09C 3/04* | (2006.01) |
| *C01G 49/00* | (2006.01) |

(52) U.S. Cl.
CPC .............. *B41M 5/267* (2013.01); *B41M 5/26* (2013.01); *C09C 1/34* (2013.01); *C09C 3/04* (2013.01); *G03F 7/0042* (2013.01); *C01B 21/062* (2013.01); *C01B 21/0622* (2013.01); *C01B 32/90* (2017.08); *C01B 33/06* (2013.01); *C01G 39/00* (2013.01); *C01G 49/00* (2013.01); *C01P 2006/62* (2013.01); *C01P 2006/63* (2013.01); *C01P 2006/64* (2013.01)

(58) Field of Classification Search
CPC ........ B41M 5/267; B41M 5/26; G03F 7/0042
See application file for complete search history.

(56) References Cited

U.S. PATENT DOCUMENTS

| | | | |
|---|---|---|---|
| 4,556,893 A * | 12/1985 | Rinehart ............ | G11B 7/00451 346/135.1 |
| 4,769,310 A | 9/1988 | Gugger et al. | |
| 6,028,134 A | 2/2000 | Zhang et al. | |
| 6,391,516 B1 * | 5/2002 | Vermeersch .......... | B41C 1/1025 430/270.1 |
| 6,848,964 B1 | 2/2005 | Sasaki et al. | |
| 6,855,910 B2 | 2/2005 | Harrison | |
| 7,202,288 B2 | 4/2007 | Kniess et al. | |
| 7,485,403 B2 | 2/2009 | Khan | |

(Continued)

FOREIGN PATENT DOCUMENTS

| | | | | |
|---|---|---|---|---|
| EP | 867466 | * | 9/1996 | .............. B41M 5/36 |
| EP | 2050720 A1 | | 4/2009 | |

(Continued)

OTHER PUBLICATIONS

GSLA T-LMM-14 aerosol Safety data sheet, Ferro Corporation, 15 pages (Nov. 2015).*
Espacenet bibliographic data for WO2006051238 published May 18, 2006, one page.
Espacenet bibliographic data for JP4782626 published Sep. 28, 2011, one page.
Espacenet bibliographic data for EP2050720 published Apr. 22, 2009, two pages.
Espacenet bibliographic data for JPH04210882 published Jul. 31, 1992, one page.
Espacenet bibliographic data for JPS6330289 published Feb. 8, 1988, one page.

(Continued)

*Primary Examiner* — Martin J Angebranndt
(74) *Attorney, Agent, or Firm* — Rankin, Hill & Clark LLP

(57) ABSTRACT

A universal or all-purpose laser marking composition for forming satisfactorily dark laser marks on a wide variety of substrates is provided. The marking composition comprises an enhancer of nitrides, carbides, silicides, and combinations thereof. The enhancer may be selected one or more of ferromanganese, ferrosilicon, $Fe_xSi_{(1-x)}$ where X can range from about 0.005 to 0.995, $Fe_5Si_2$, MgFeSi, SiC, CaSi, (Co)Mo, $MoSi_2$, $TiSi_2$, $ZrSi_2$, $WSi_2$, $MnSi_2$, YSi, $Cu_5Si$, $Ni_2Si$, $Fe_3C$, $Fe_7C_3$ and $Fe_2C$, MoC, $Mo_2C$, $Mo_3C_2$, $YC_2$, WC, $Al_4C_3$, $Mg_2C$, $Mg_2C_3$, $CaC_2$, $LaC_2$, $Ta_4C_3$, $Fe_2N$, $Fe_3N$, $Fe_4N$, $Fe_7N_3$, $Fe_{16}N_2$, MoN, $Mo_2N$, $W_2N$, WN, $WN_2$, and combinations thereof and combinations thereof. Upon disposing the marking composition on a substrate and exposing the marking composition to laser radiation, the marking composition absorbs the laser radiation, increases in temperature, chemically bonds with the substrate, and when formed on each of a metal, glass, ceramic, stone, and plastic substrates, the mark has a negative ΔL dark contrast value of at least −1 compared to a mark formed by the marking composition without the enhancer.

14 Claims, 15 Drawing Sheets

(56) References Cited

U.S. PATENT DOCUMENTS

| | | | | |
|---|---|---|---|---|
| 8,157,905 B2* | 4/2012 | Lewis | ...................... | B41M 3/14 |
| | | | | 106/31.32 |
| 8,278,243 B2 | 10/2012 | Khan et al. | | |
| 8,461,075 B2 | 6/2013 | Watanabe et al. | | |
| 8,642,504 B2 | 2/2014 | Campbell et al. | | |
| 8,753,791 B2 | 6/2014 | Khan | | |
| 8,765,855 B2 | 7/2014 | Thaker | | |
| 8,936,901 B2 | 1/2015 | Khan | | |
| 9,034,089 B2 | 5/2015 | Jarvis et al. | | |
| 9,415,463 B2 | 8/2016 | Ueta et al. | | |
| 9,487,437 B2 | 11/2016 | Walp | | |
| 9,498,999 B2 | 11/2016 | Khan | | |
| 9,534,344 B2 | 1/2017 | Inuzuka et al. | | |
| 2005/0231585 A1* | 10/2005 | Mudigonda | ............ | B41M 5/267 |
| | | | | 347/238 |
| 2006/0040217 A1* | 2/2006 | Stubbs | .................. | B41M 5/267 |
| | | | | 430/363 |
| 2007/0154642 A1 | 7/2007 | Klein et al. | | |
| 2007/0166534 A1 | 7/2007 | Entenmann et al. | | |
| 2008/0249210 A1 | 10/2008 | Entenmann et al. | | |
| 2008/0305328 A1* | 12/2008 | Green | .................... | B41M 5/267 |
| | | | | 428/354 |
| 2010/0015558 A1* | 1/2010 | Jarvis | .................... | B41M 5/267 |
| | | | | 430/346 |
| 2010/0018957 A1* | 1/2010 | Khan | ..................... | B41M 5/267 |
| | | | | 219/121.85 |
| 2010/0046191 A1 | 2/2010 | den Boer et al. | | |
| 2010/0075848 A1* | 3/2010 | Khan | ..................... | C09D 11/50 |
| | | | | 503/201 |
| 2010/0310787 A1 | 12/2010 | Lehmann et al. | | |
| 2011/0024667 A1 | 2/2011 | Mamak et al. | | |
| 2011/0156382 A1 | 6/2011 | Uyttendaele | | |
| 2011/0159268 A1* | 6/2011 | Jarvis | ...................... | B41M 5/26 |
| | | | | 428/221 |
| 2011/0198358 A1* | 8/2011 | Parent | .................... | A47J 36/02 |
| | | | | 220/573.1 |
| 2011/0248225 A1 | 10/2011 | Mamak et al. | | |
| 2013/0188003 A1 | 7/2013 | Thaker | | |
| 2013/0235145 A1* | 9/2013 | Geuens | ................. | B41M 3/142 |
| | | | | 347/232 |
| 2014/0147392 A1* | 5/2014 | O'Rourke | ............. | B41M 5/267 |
| | | | | 424/10.1 |
| 2014/0147775 A1* | 5/2014 | Jarvis | ..................... | B41M 5/262 |
| | | | | 430/17 |
| 2014/0285612 A1 | 9/2014 | Uyttendaele | | |
| 2014/0370247 A1* | 12/2014 | Detrie | ................... | B23K 26/18 |
| | | | | 428/195.1 |
| 2015/0125626 A1* | 5/2015 | Sakoske | ............... | C04B 41/4572 |
| | | | | 106/31.05 |
| 2016/0199877 A1* | 7/2016 | Sarver | ..................... | B05D 3/06 |
| | | | | 427/556 |
| 2016/0251258 A1* | 9/2016 | Yang | ......................... | C03C 3/14 |
| | | | | 501/15 |
| 2019/0229067 A1* | 7/2019 | Sarver | ..................... | C08L 23/12 |

FOREIGN PATENT DOCUMENTS

| | | | | |
|---|---|---|---|---|
| GB | 2447659 A | | 9/2008 | |
| JP | 61-177286 | * | 8/1986 | ............... G11B 7/24 |
| JP | 62-023968 | * | 1/1987 | ............... C23F 4/00 |
| JP | 6330289 A | | 2/1988 | |
| JP | 02-048987 | * | 2/1990 | ............... G11B 7/251 |
| JP | 02-277689 | * | 11/1990 | ............... G11B 7/243 |
| JP | 03-116801 | * | 5/1991 | ............... H01C 7/00 |
| JP | 04210882 A | | 7/1992 | |
| JP | 4782626 B2 | | 9/2011 | |
| WO | 2006/051238 A1 | | 5/2006 | |

OTHER PUBLICATIONS

"Phthalocyanine Blue" ChemSrc, 2016, five pages.

Title: International Critical Tables of Numerical Data, Physics, Chemistry and Technology (1st Electronic Edition), Table: Physical Properties of Inorganic Compounds (B-Table), 2003, Knovel, one page.

Beyler et al., "Thermal Decomposition of Polymers," Section One, Chapter 7, pp. 1-110-1-131.

Holloway et al., Advanced Polymer Composites and Polymers in the Civil Infrastructure, 2001, p. 14.

* cited by examiner

CARBIDE, NITRIDE AND SILICIDE ENHANCERS FOR LASER ABSORPTION

FIELD

The present subject matter relates to laser marking compositions for use in laser marking operations and various methods of laser marking using such compositions. The present subject matter also relates to articles marked using the noted marking compositions and/or methods.

BACKGROUND

Laser marking is a marking technique that uses lasers and other forms of laser radiation to additively bond a marking substance to a wide range of substrates. Laser marking forms permanent marks on material such as metals, glass and ceramic parts, and is used in many applications, ranging from aerospace to awards and engraving industries. Laser marking differs from the more widely known techniques of laser engraving and laser ablation in that laser marking is an additive process, adding material to the substrate to form the marking instead of removing material as in those techniques.

Individual laser bonding/marking compositions have had limited success when used to mark different types of substrate materials, and are therefore classified according to the particular material to be marked. Instead, laser marking compositions are usually tailored for marking specific types of material. For example, a single laser marking composition may leave a satisfactory laser mark on stainless steel, but may leave an unsatisfactory mark on other materials such as different grades of aluminum, anodized aluminum, brass, copper, pewter, titanium, glass, ceramic, natural substances such as rock (e.g. slate) or paper products, and plastic. In order to mark on these other materials, different laser marking compositions have to be used than those used for marking stainless steel. Accordingly, there is a need for a high contrast laser marking composition that can be used for marking a variety of materials.

BRIEF DESCRIPTION

The difficulties and drawbacks associated with previously known materials and practices are addressed in the present marking compositions and methods for laser marking.

According to one aspect, a marking composition for forming marks or indicia on a substrate upon laser irradiation is provided. The marking composition comprises an enhancer selected from the group consisting of nitrides, carbides, silicides, and combinations thereof. Upon disposing the marking composition on a substrate and exposing the marking composition to laser radiation, while not wishing to be bound by theory, it is believed the marking composition absorbs the laser radiation, increases in temperature, chemically bonds with the substrate, and forms a fused mark on the substrate having a luminance, color value, or degrees of opacity that provides visual contrast with the substrate, and when formed on each of a metal, glass, ceramic, stone, and plastic substrates, the mark has a negative ΔL dark contrast value of at least −1 or more negative (e.g. −2), or −1 to −4, or −5 to −9, or −10 or more negative, when compared to a mark formed using a similar composition but without an enhancer selected from the group consisting of nitrides, carbides, and silicides. When the mark has a negative ΔL value of at least −1, the mark has visible contrast with a mark formed using similar composition but without an enhancer. When the mark has a negative ΔL value of −1 to −4, the mark has noticeable contrast with a mark formed using a similar composition but without an enhancer. When the mark has a negative ΔL value of −5 to −9, the mark has good contrast with a mark formed using a similar composition but without an enhancer. When the mark has a negative ΔL value of −10 or more negative, the mark has significant contrast with a mark formed using a similar composition but without an enhancer.

According to another aspect, a method of laser marking a substrate comprises providing a substrate selected from the group consisting of metal, glass, ceramic, stone, and plastic. The method includes providing a marking composition including an enhancer selected from the group consisting of nitrides, carbides, silicides, and combinations thereof. The method also includes disposing the marking composition on at least a portion of the substrate. The method further includes exposing at least a portion of the marking composition to laser radiation such that the irradiated portion of the marking composition absorbs the laser radiation, increases in temperature, chemically bonds with the substrate, and forms a fused mark on the substrate that has a luminance, color, and/or degree of opacity that contrasts from the substrate. When formed on each of the metal, glass, ceramic, stone, and plastic substrates, the mark has a negative ΔL dark contrast value of at least −1, or −1 to −4, or −5 to −9, or −10 or more negative, when compared to a mark formed by a similar composition but without an enhancer selected from the group consisting of nitrides, carbides, and silicides. When the mark has a negative ΔL value of at least −1, the mark has visible contrast with a mark formed using similar composition but without an enhancer. When the mark has a negative ΔL value of −1 to −4, the mark has noticeable contrast with a mark formed using a similar composition but without an enhancer. When the mark has a negative ΔL value of −5 to −9, the mark has good contrast with a mark formed using a similar composition but without an enhancer. When the mark has a negative ΔL value of −10 or more negative, the mark has significant contrast with a mark formed using a similar composition but without an enhancer.

As will be realized, the present subject matter is capable of other and different embodiments and its several details are capable of modifications in various respects, all without departing from the present subject matter. Accordingly, the drawings and description are to be regarded as illustrative and not restrictive.

DETAILED DESCRIPTION

Figure 1:
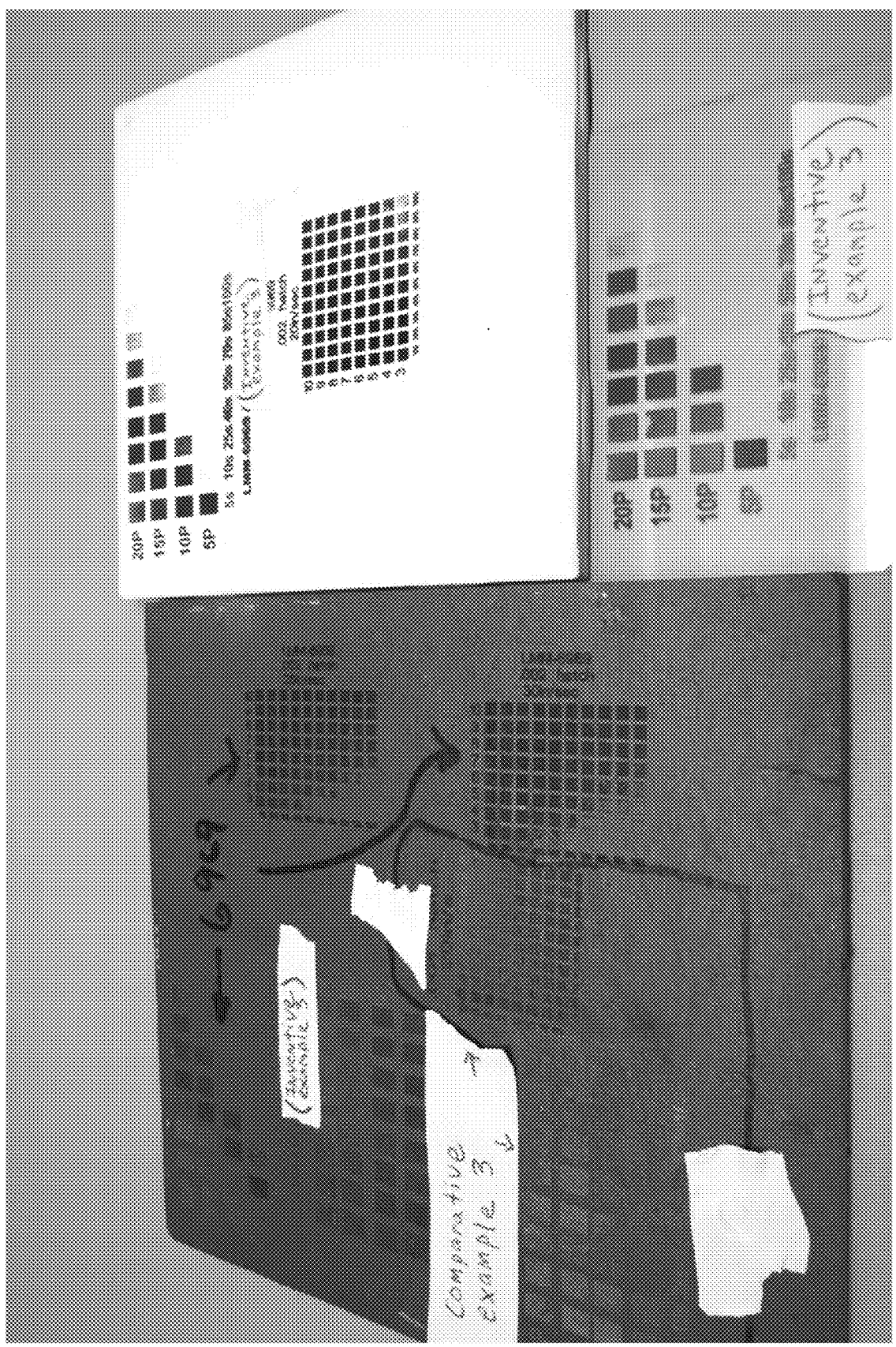
FIG. 1 is a photograph of several substrates laser marked with a marking composition in accordance with the present subject matter.

The present subject matter relates to a universal or all-purpose laser marking composition that, upon irradiation with a laser, leaves a satisfactory dark mark with high contrast on a variety of materials including metal, glass, ceramic, natural substances, and plastic. The metal substrates may include substrates made from, for example, regular and anodized steel, aluminum, brass, titanium, etc. The natural substance substrates may include substrates made from, for example, clay bricks, cellulose material, or stone such as slate. The plastic substrates may include substrates made from polymers such as, for example, polycarbonate, acrylate, polyurethane, etc.

The invention of the present subject matter makes it possible to leave a satisfactory mark on a wide range of materials using a single marking composition, rather than having to use different laser marking compositions tailored for each particular material to be marked.

The present subject matter provides various marking compositions, methods, and articles marked using the noted marking compositions and methods. The marking compositions comprise one or more populations of enhancers, which are included in the marking composition and allow the marking composition to leave satisfactory laser marks on a variety of substrates. In accordance with the present subject matter, it has been discovered that certain aspects of the resulting marks can be significantly improved or enhanced by selection and use of marking compositions having the enhancers.

For example, surface bonding between the particles and the substrate can be enhanced by use of the marking compositions having the described enhancers. Generally, a darker, more contrasting laser mark results if the enhancer is included, irrespective of the substrate material. That is, by use of the described enhancer in a laser marking composition, an increase in contrast in laser formed marks can be achieved at a broader range of power settings and scanning rates, i.e. at lower laser energies and shorter times, to higher laser energies and longer times (i.e. at various time and power ratings). These and other advantages and benefits are described in greater detail herein.

Marking Compositions

As used herein, the term "marking composition" means a material that can be disposed on a region of a substrate and irradiated by a laser to provide an additive mark on the substrate that visually contrasts with the substrate. In this regard, the mark is formed in an additive process on the substrate, rather than in a subtractive process such as by laser ablation, wherein the mark is formed by adding material (i.e. the marking composition) to the substrate. While not being bound to any particular theory, it is believed that upon disposing the marking composition on a substrate and exposing the marking composition to laser radiation, the marking composition absorbs the laser radiation, increases in temperature, and chemically bonds with the substrate to form a fused mark on the substrate having a luminance, color value, or degrees of opacity that provides visual contrast with the substrate. The marking composition of the present subject matter are considered "universal" or "all-purpose" marking composition because when formed on various materials, for example when formed on each of a metal, glass, ceramic, slate, and plastic substrates, the mark has a negative $\Delta L$ dark contrast value of at least −1, or −1 to −4, or −5 to −9, or −10 or more negative, when compared to a mark formed by a similar composition but without an enhancer selected from the group consisting of nitrides, carbides, and silicides. When the mark has a negative $\Delta L$ value of at least −1, the mark has visible contrast with a mark formed using similar composition but without an enhancer. When the mark has a negative $\Delta L$ value of −1 to −4, the mark has noticeable contrast with a mark formed using a similar composition but without an enhancer. When the mark has a negative $\Delta L$ value of −5 to −9, the mark has good contrast with a mark formed using a similar composition but without an enhancer. When the mark has a negative $\Delta L$ value of −10 or more negative, the mark has significant contrast with a mark formed using a similar composition but without an enhancer.

The resultant marked region contrasts with the non-irradiated region of the substrate, e.g., the marking may have a different (i.e. contrasting) luminance/lightness value and/or color value on the Hunter Lab scale as compared with the non-irradiated region.

In the Hunter Lab scale, also CIELAB scale (so named for the variables L, a, and b), L measures luminance or lightness and varies from 100 for perfect white to zero for black, approximately as the eye would evaluate it. Where DL=L (sample)−L (standard). If DL (which can also be expressed as $\Delta L$) is positive, the sample is lighter than the standard. If DL is negative, the sample is darker than the standard.

The chromaticity dimensions (a and b) give understandable designations of color. The a dimension measures redness when positive, gray when zero, and greenness when negative. Where Da=a(sample)−a(standard). If Da (or $\Delta a$) is positive, the sample is redder than the standard. If Da is negative, the sample is greener than the standard.

The b dimension measures yellowness when positive, gray when zero, and blueness when negative. Where Db=b (sample)−b(standard). If Db (or Δb) is positive, the sample is yellower than the standard. If db is negative, the sample is bluer than the standard.

The Hunter total color difference (DE or ΔE) for any illuminant or observer is calculated as $\Delta E=\sqrt{(\Delta L^2+\Delta a^2+\Delta b^2)}$.

In one embodiment of the present subject matter, the marking composition provides contrasting laser marks having different lightness values (L) as compared with the substrate lightness value (L), providing a negative lightness value difference ΔL between that of the substrate and that of the irradiated marking composition as determined by the standard CIELAB scale. In another embodiment, the marking compositions provide contrasting laser marks having different color values (a and b) than the substrate. In still another embodiment, the marking compositions provide optimum color characteristics having certain degrees of opaqueness to cover the laser marked portion of the substrate and provided contrast with the remaining portion of the substrate. In yet another embodiment, the marking compositions provided a laser mark having lightness values, color values, degrees of transparency, translucence, opacity, and combinations thereof to provide contrast from the unmarked portion of the substrate.

The resulting laser markings made in accordance with the present subject matter may need to be opaque for one application (such as in ceramic applications), while another application the laser markings are colored, but may also have a certain degree of transparency or translucency to show a certain effect on the substrate. The negative difference in lightness values ΔL between the marked and unmarked regions typically has an absolute value of greater than about 10 as measured with a CIE D65 illuminant at 10 degrees. The absolute value of ΔL is greater than about 20 in one embodiment, or greater than about 25 in another embodiment. In a particular embodiment, the absolute value of ΔL is about 30 or higher. The laser markings made in accordance with the present subject matter and corresponding L, a, and b values for those markings are measured with a spectrophotometer using a CIE D65 illuminant at 10 degrees.

The opacity or opaqueness of a laser mark can be measured with a spectrophotometer over a black and white Leneta card. In one embodiment, the contrast measured over black and then white Leneta backgrounds for the opacity of a laser mark is from about 1 ΔE to about 5 ΔE and in another aspect from about 0.5 ΔE to about 2 ΔE.

Enhancer

The present subject matter laser marking compositions generally comprise and enhancer selected from the group consisting of nitrides, carbides, and silicides. In many of the marking compositions described herein, more than one enhancer is provided. For example, a marking composition may include a first enhancer, a second enhancer, and still additional enhancers.

The enhancer may include one or more of ferromanganese (FeMn), ferrosilicon (FeSi), $Fe_5Si_2$, MgFeSi, SiC, CaSi, (Co)Mo, $MoSi_2$, $TiSi_2$, $ZrSi_2$, $WSi_2$, $MnSi_2$, $YSi$, $Cu_5Si$, $Ni_2Si$, $Fe_3C$, $Fe_7C_3$ and $Fe_2C$, $MoC$, $Mo_2C$, $Mo_3C_2$, $YC_2$, $WC$, $Al_4C_3$, $Mg_2C$, $Mg_2C_3$, $CaC_2$, $LaC_2$, $Ta_4C_3$, $Fe_2N$, $Fe_3N$, $Fe_4N$, $Fe_7N_3$, $Fe_{16}N_2$, $MoN$, $Mo_2N$, $W_2N$, $WN$, $WN_2$, and combinations thereof, such as various stoichiometric alloys may also be employed for example, in the case of Ferrosilicon $Fe_xSi_{(1-x)}$ where X can range from about 0.005 to 0.995 typical alloy values may be X=0.85, X=0.55, X=0.25, or X=0.10. The enhancer may be included at 2-20 wt %, 3-17 wt %, or 5-15 wt % of the laser marking composition.

While not being bound to any particular theory, it is believed that the enhancer acts as a reducing or deoxidizing agent when irradiated with laser radiation to provide an improved mark (darker, more contrasting) than compared to a laser marking composition not including the enhancer.

In one embodiment, the laser marking composition also includes mixed metal oxide pigment, $MoO_3$, silicate mineral, binder, solvent, and dispersant.

Mixed Metal Oxide Pigment

In one embodiment, the marking composition includes one or more mixed metal oxide (MMO) pigments, also known as complex inorganic color pigments (CICP), for imparting a color to the laser marking. Almost an infinite variety of colors can be achieved by using different and combinations of MMO pigments. MMO pigments are compounds including at least two metals along with oxygen. MMO pigments include rutile, hematite, or spinel crystal structures. MMO pigments can include metals such as cobalt, iron, chrome, tin, antimony, titanium, manganese and aluminum. The MMO pigment may be produced by calcination at temperatures of 800° C. to 1300° C. of a mixture of metal precursor materials.

The one or more MMO pigments may be included at 5-35 wt %, 15-30 wt %, or about 20-25 wt % of the marking composition. The MMO pigment is not particularly limited, and in one embodiment includes a cobalt-chromium-manganese-iron MMO pigment. Additionally, other coloring agents, such as pigments or dyes, can be used.

Silicate Mineral

In addition to other components, a silicate mineral(s) is optionally added to the marking compositions to adjust the rheological properties of the marking compositions and to provide durability for the laser markings. The silicate material may be included at 1-15 wt %, 2-12 wt %, or 5-10 wt % of the marking composition.

Non-limiting examples of silicate minerals that can be used in accordance with the present subject matter include phyllosilicates selected from the serpentine group, the clay mineral group, the mica group, and the chlorite group. In one embodiment, the marking composition includes mica.

The particle size of the silicate minerals is not particularly limited, and the particles can have a median average particle size of about 0.5-60 μm, 5-50 μm, 20-35 μm.

Transition Metal Oxide

The marking composition can also include one or more transition metal oxides, which provides laser absorbing synergy to the marking compositions. The transition metal oxides may be included at 0.05-10 wt %, 1-9 wt %, or 3-8 wt % of the marking composition.

Non-limiting examples of transition metal oxides that can be used in accordance with the present subject matter include molybdenum oxide ($MoO_3$), and oxides of vanadium, manganese, iron, cobalt, nickel, copper, zinc, tungsten, titanium, chromium, and compounds and mixtures of these. In one embodiment, $MoO_3$ is included in the marking composition.

Binder

The marking compositions of the present subject matter may comprise a binder to improve rheological properties, film formation, green strength, or package stability for the marking compositions. Binders may be included at 0.01-5 wt %, 0.5-4 wt %, or 1-3 wt %.

The binder may be dissolved in the solvent, and can include one or more epoxies, polyesters, acrylics, cellulosics, vinyls, natural proteins, styrenes, polyalkyls, carbonates, rosins, rosin esters, alkyls, drying oils, and polysaccharides such as starches, guar, dextrins and alginates, and the like, and derivative thereof. In one embodiment, the binder includes hydroxypropyl cellulose.

Solvent

In accordance with the present subject matter one or more solvents are incorporated into the marking composition. The solvent can be included at 35-65 wt %, 40-60 wt %, or 45-55 wt %. The solvents can comprise water or other aqueous-based liquids, or one or more organic solvents. If water is selected as the carrier, the water can be purified water, e.g. deionized water.

Non-limiting examples of other solvents include alcohols such as ethanol. Non-limiting examples of organic solvents include ketones, alkanes such as butane (such as if in liquid form as a result of pressurization such as may be used for spray applications), and aromatic organic solvents such as xylenes.

In accordance with the present subject matter, the marking compositions may include solvents such as water, alcohols, polyols, chlorinated solvents, amines, esters, glycol ethers, ketones, terpenes, petroleum naphthas, aromatic hydrocarbons and natural oils. Other suitable carriers include furans, isoparaffins, N,N dimethylformamide, dimethylsulfoxide and tributylphosphine. In one embodiment, the solvent includes ethanol.

Dispersant/Surfactant

One or more dispersants or surfactants can be included the marking composition to aid in wetting, dispersing, and deflocculating the of nitrides, carbides, and silicides enhancer and other components of the marking composition that are in particle form. In combination with particle size optimization, the dispersant inhibits coalescing or clumping of the particles. If the particles are subjected to a particle size reduction operation, the dispersant can be added during size reduction to inhibit the particles from aggregating together to form larger bodies. The dispersant can be included at 0.1-10 wt %, 1-8 wt %, or para.

The dispersants are not particularly limited by the present subject matter. Examples of suitable dispersants include, but are not limited to, Anti Terra 204, which is solution of a polycarboxylic acid salt of polyamine amides, and DISPERSBYK182, which is a solution of a high molecular weight block copolymer with pigment-affinic groups, both of which are supplied by BYK Additives and Instruments, Abelstraße 45, 46483 Wesel, Germany.

Generally, any surface active dispersant, silicon based dispersant, etc., may be suitable for use in the marking compositions. Non-polymeric and polymeric surface active dispersants, surfactants or agents can be incorporated into the formula.

Preparation of the marking composition in liquid form can, for example, occur through low shear mechanical mixing, high shear mechanical mixing, ultrasonic mixing and/or milling, or the like.

Depending upon the type of application technique, the components of the marking compositions will vary. For example, if a tape is being produced, the marking composition may comprise a considerable amount of binder. However, if a powder is being formed, such powder may be free of binder. Similarly, if a liquid application technique is being used, a considerable amount of solvent may be utilized, whereas with a powder, little or no solvent would be employed. One or more additional components may also be included.

The marking compositions made in accordance with the present subject matter can be formulated with fewer or additional components in ways that makes them suitable for one of many application techniques depending upon the particular requirements of the final marking process. For example, the marking compositions may be incorporated into a powder, a tape or a liquid medium.

Additional Components

The marking compositions may optionally include one or more additional components (i.e. additives) generally known in the art to improve dispersability, wetting, flow and rheology, and to relieve surface defects.

The present subject matter marking compositions may incorporate these additional components depending on the intended application. Non-limiting examples of typical additives include glass frits, glass frit precursors, metal oxides, metals, fluxes, oxidizers, reducers, coloring agents, viscosity adjusting agents, flow controllers, stabilizers, and clarity promoters to promote maintenance of optical characteristics of the marking compositions. As noted, the use of one or more additives in the marking composition(s) is optional.

Examples of glass frits include those comprising alkali metal oxides, alkaline earth metal oxides, silica, boric oxide and transition metal oxides. In addition to glass frit, precursors of such glass frit materials may be used for the marking compositions. Examples of glass frit precursors include metal oxides with glass formers, such as silica, zinc oxide, bismuth oxide, sodium borate, sodium carbonate, feldspars, fluorides, and the like.

Generally, mark quality depends on a variety of factors, including the substrate used, marking speed, laser spot size, beam overlap, materials thickness, and laser operation parameters. The marking compositions may be applied to the substrate by various methods including a brush on technique, masking, dosing, wet and dry electrostatic deposition, dispensing, coating, metering, painting, spraying, dipping, water fall, pad printing, screen printing, roll coating, tape, digital electronic deposition using such application techniques as ink jet and valve jet application, and others.

The marking processes generally comprise three operations. One operation involves application of the marking composition to a substrate. Another operation involves bonding of the marking composition to the substrate with a laser. The laser used to form the laser marks is not particularly limited, and can comprise a fiber laser, a $CO_2$ laser, diode laser, or other lasers. And, still another operation involves removal of excess, unbonded marking composition from the substrate in the cases where the application technique deposits excess material that is not subject to the laser energy for making the desired mark.

In accordance with the present subject matter, a selected portion of the marking composition is permanently adhered to the substrate upon irradiation. As used herein, the term "adhere" is used to designate any permanent means of attachment of the irradiated marking composition to the substrate. For example, the irradiated marking composition may be adhered to the surface of the substrate by sintering the marking composition to the substrate, fusing the marking composition to the surface of the substrate, diffusing at least a portion of the marking composition into the substrate, chemically bonding the marking composition with the substrate by chemical reaction, and the like. In several embodiments, the marking composition is chemically bonded to the substrate.

As used herein, the term "permanent marking" means a non-temporary marking which, for example, possesses relatively high wear resistance, corrosion resistance and/or fading resistance. While not being bound to any particular theory, it is believed that the interaction of the laser radiation and the marking composition results in an inert coating mechanically and chemically bonded to the substrate material. The marking composition is believed to form covalent bonds with the substrate material upon laser irradiation, and it is believed this chemical bond exceeds the strength of the mechanical bond.

Upon bonding of the marking composition to the substrate by exposure to laser radiation, the resulting marking composition is fused to the substrate, and in most cases the marking composition is as durable as the substrate itself.

Use of and/or the combination of different marking compositions, second and/or subsequent applications of marking compositions and/or the adjustment of laser operation parameters will result in variations in the durability, appearance, and structural form of the resulting laser mark and are part of the present subject matter. All of these marking characteristics can be achieved with the use of a single low-power, low-cost air-cooled diode laser.

Application

In a particular aspect, the present subject matter provides various application methods for disposing the marking composition to a substrate.

The thickness of the resulting coating can be adjusted and/or controlled by the use of viscosity agents in the marking composition, by the control of temperature, and by using optional treatments or pre-coatings on the surface to be marked. Depending upon the concentration of the coloring agent(s) (MMO pigment) in the marking composition and other factors, adjusting the coating thickness can be used to at least partially control contrast or darkness of the markings. Typically, thickness of the coating will vary depending upon coating chemistry and heat stability.

Marking compositions are typically applied to the substrate with a thickness of at least about 0.1 micron, alternatively from about 1 to about 300 microns, or from about 5 to about 200 microns, or from about 10 to about 100 microns.

The present subject matter marking compositions can be disposed on a substrate by different means depending on the requirements for different applications. The characteristics of the laser markings can be tailored in part by altering the components of the marking compositions and in part by selecting the appropriate method for applying the marking compositions to a substrate.

In accordance with the present subject matter, the marking compositions are in both solid (e.g. a dry powder or tape) and liquid (e.g. a slurry) forms.

In one aspect, the present subject matter comprises a solid marking composition in the form of a powder. Marking compositions in powder form can be brought into contact with the substrate surface at the desired thickness by solvent-less or low-solvent methods such as tape casting, powder deposition, powder dispensing, powder coating, powder metering, powder dosing, powder masking, powder painting, or the like.

In another aspect, the present subject matter comprises a marking composition in the form of a liquid. Water based methods may be used because of their minimal environmental impact, but solvent based methods can also be used to control drying rate, dispersion or moisture sensitivity of certain marking compositions. In accordance with one embodiment, sol gel materials may be used to apply the marking composition to the substrate. Where dispersions are used, the deposited layer of marking composition can be dried prior to being exposed to laser radiation, however this is not necessary. The marking composition in liquid form can be applied onto the substrate surface by various methods such as screen printing, painting, flood coating, brushing, spraying, roll coating, dipping, flow coating, electrostatic application and doctor blading.

In one aspect of the present subject matter, marking compositions in liquid form are coated in the form of a tape onto a surface of a carrier film. The marking composition can, for example, be in the form of a tacky layer, arranged on a carrier film of polyester, polyethylene, polypropylene, or paper for example.

The marking compositions in tape form be disposed on a portion of a substrate and the carrier film can be removed. The tape can be transparent, opaque, or translucent. The use of a tape insures proper and uniform thickness and uniform distribution of components in the marking composition that is brought into contact with the substrate surface. It is not necessary that carrier film be used. It is also contemplated the carrier film need not be removed before laser irradiation, so long as the film does not interfere with the marking composition, and laser radiation can penetrate the thickness of the film to reach the marking composition to produce markings on the surface of interest.

Additional materials used in the application of the marking composition in liquid form or in the fabrication of tape may be substantially vaporized into combustion by-products and vented away from the substrate. A laminar air flow across the surface of the substrate can be created by venting and/or exhausting equipment to insure a consistent localized environment in which the process can occur.

In another aspect, marking compositions are dispersed in high temperature waxes or polymers in the form of a hot melt marking composition that is applied by heating the hot melt to liquid form and coating the substrate with the liquid, or by rubbing the surface of the substrate with such hot melt material while in solid form.

Bonding

After the marking composition is applied to the surface of the substrate, a selected portion of the marking composition is irradiated with a laser beam (i.e. laser radiation) to adhere the irradiated portion of the marking composition to the substrate and to form a permanent marking thereon. For many types of markings, the selected portion of the marking composition to be irradiated may comprise from about 1 to about 99 percent of the total surface area of the layer of marking composition, typically from about 5 to about 95 percent. In one embodiment, a laser is used to selectively irradiate the marking composition. However, other forms of focused energy may be used in accordance with the present subject matter. Irradiation may be achieved by moving a laser beam over a stationary substrate using conventional beam steering methods, by moving the substrate in relation to the laser beam, and/or by masking the substrate. Laser irradiation is typically achieved by directing the laser beam directly against the layer of marking composition, but may also be achieved by directing the beam through a sufficiently transparent substrate.

A wide array of lasers can be used for the present subject matter. Useful lasers for use in the present methods are those known as $CO_2$ lasers, fiber lasers, diode lasers, excimer lasers, green lasers, red lasers, UV lasers, and others.

A $CO_2$ laser produces a beam of infrared light with the principal wavelength bands centering around 9.4 and 10.6 micrometers. $CO_2$ lasers are available commercially from numerous sources. A suitable $CO_2$ laser is a 35 watt $CO_2$ laser with about 9.2 micron to about 11.4 micron wavelength.

A fiber laser is a laser in which the active gain medium is an optical fiber doped with rare-earth elements such as erbium, ytterbium, neodymium, dysprosium, praseodymium, and thulium. They are related to doped fiber amplifiers, which provide light amplification without lasing. Fiber lasers are also commercially available from numerous sources. A suitable fiber laser is a 10 watt non-pulsed fiber laser with about 904 nm to about 1065 nm wavelength.

Generally, the intensity of the laser and the particular wavelength or ranges of wavelength(s) are selected based upon the characteristics of the marking composition and the surface to be laser marked. Typical settings for a 35 watt $CO_2$ laser for universal laser markings is from about 2% to about 100% of full power at about 5 to about 100 inches per second speeds. For most coatings, a power level from about 2% to about 35% of full power at about 3 to about 100 inches per second speeds are used. A 10 watt fiber laser can be used from about 3 to 100 inches per second speeds and the power can be from about 1 to about 10 watts. The term "speed" as used herein refers to the velocity of the marking head as it moves across the surface being lased. The marking conditions will vary from one laser to another and achieving a mark is not limited to a particular laser. Changing to a higher or lower watt laser would change the marking parameters, and so one could mark at a lower % power and faster speed or vice versa. The particular combination of power setting, marking speed, and other parameters for the laser of interest can be determined by empirical testing to identify the optimum settings.

The actual power levels as measured at the surface to be marked are slightly different (more or less) than the power measurement of the laser as delivered. As will be appreciated, this is primarily due to the efficiency of the laser tube. A wide array of other lasers can be used such as YAG pulsed lasers, diode lasers, excimer lasers, green lasers, red lasers, UV laser and others.

In accordance with the present subject matter, the size of the laser spot that impinges the marking composition is typically greater than 0.1 micron in diameter, alternatively from about 0.1 to about 20 microns, or from about 0.5 to about 10 microns. The speed at which the laser beam travels across the surface of the marking composition can range from 1 to about 100 inches/minute (up to about 250 cm/minute), alternatively from about 1 or 2 to about 20 inches/minute (about 2.5 or 5 to 50 cm/minute) for most thicknesses and ingredients of the marking composition. The laser beam may be projected with a seam overlap of 1 to 100 percent, alternatively from about 10 to about 90 percent for many applications. The laser parameters are controlled in order to provide sufficient localized heating of the marking composition while avoiding unwanted damage to the substrate.

Once the marking composition is disposed on a portion of the substrate, the beam emanating from the laser radiation source impinges upon the marking composition, which absorbs the laser radiation and increases to the required temperature. In absorbing the laser radiation, at least a portion of the marking composition is excited, i.e. has its atoms or molecules raised to an excited state. [See Webster's Encyclopedic Unabridged Dictionary of the English Language (Portland House, New York, 1989), page 497.] Typically, a temperature of 200° F. to 1500° F. is reached in approximately one to two microseconds. Precise temperatures are controlled by the output power of the laser radiation source and the physical position of the marking composition relative to the focal plane of the laser radiation beam and the speed with which the beam is moving. Once the required temperature is achieved, the marking composition and substrate will permanently bond together to form a new marking layer atop the substrate. Marking compositions can be formulated to absorb specific amounts of a specified wavelength of the laser radiation.

The permanent markings produced in accordance with the present subject matter have a thickness of from 0.01 to about 100 microns as measured from the surface of the substrate. In another aspect, the thickness is from about 0.05 to about 30 microns. In one aspect, substantially no indention or removal of the substrate is observed.

Several different methods are suitable for laser marking, for example: a) the mask method whereby the surface to be marked is uniformly coated with the marking composition and the laser radiation is passed through a fixed, data specific mask and the laser radiation therefore impinges only the unmasked portions of the marking composition to produce the desired mark; b) the dot-matrix method whereby the surface to be marked is uniformly coated with the marking composition and the laser radiation passes through a computer controlled, changeable data, dot-matrix mask and impinges onto the marking composition to produce the desired mark; c) the beam deflection method whereby the surface to be marked is uniformly coated with the marking composition and the laser radiation passes through a beam steering head and impinges onto the marking composition to produce the desired mark; d) the X-Y plotter method whereby the surface to be marked is uniformly coated with the marking composition and the laser radiation moves on a gantry type X-Y mechanism utilizing mirrors and/or fiber-optics and impinges onto the marking composition to produce the desired mark; e) the part moving method whereby the surface to be marked is uniformly coated with the marking composition and the workpiece to be marked is moved using an X-Y motor driven stage under a stationary beam which impinges onto the marking composition to produce the desired mark; and f) the area irradiation method whereby data specific marking composition is uniformly applied to the surface of the substrate and the data specific marking area is irradiated by means of a beam steering mechanism or by means of moving the workpiece under a stationary beam. In methods b), c), d), e) and f) the laser can be combined with a laser marking system so that the marking composition can be irradiated with any computer programmed digits, letters and special symbols where the laser beam strikes the marking composition in the most efficient manner possible.

The laser beam, the movement of which can be controlled by a computer, may be used to create discrete symbols or designs or, alternatively, may be serially indexed across the surface of the marking composition to create multiple symbols or designs at the same time. For example, a word may be created by separately making each letter of the word with the laser, or by rastering the laser across the entire word to form all of the letters at the same time.

During the irradiation step, the surface of the substrate may be exposed to any desired type of atmosphere. For example, the atmosphere may comprise air at atmospheric, sub-atmospheric or super-atmospheric pressures. Furthermore, the atmosphere may comprise an inert gas such as nitrogen, argon or carbon dioxide, an oxidizing atmosphere such as air or oxygen, a reducing atmosphere such as hydrogen or carbon monoxide, or a vacuum.

Oxidizing or reducing gases can be used in a combination with inert gases. The atmosphere to which the surface of the substrate is exposed may affect the color and the quality of the mark. A single laser beam may be used for marking in accordance with the present subject matter. Alternatively, two or more laser beams may be used.

Removal of Excess

The present subject matter methods involve removing the excess marking composition from the substrate. Excess marking composition not bonded to the substrate surface can be removed by conventional cleaning processes. In high-volume applications, the unused marking composition can be recovered from the cleaning process and reused.

Removal of excess marking composition is accomplished depending on the form and application technique employed to deliver and apply the marking composition. For example, if the marking composition was in powder form, the excess powder that was not subject to laser irradiation can be removed by wiping, dusting, washing, brushing off, vacuuming, subliming or blowing off the substrate, or the like. On the other hand, if the article used to apply the marking composition was a tape carrier, then the portion of the tape that was not irradiated by the laser can be peeled from the substrate. The irradiated portion of the marking compositions remains adhered to the substrate forming a permanent mark.

The present subject matter methods enable formation of high contrast or dark marks on a portion of a substrate. High-contrast marks or dark marks, for the purposes of this disclosure, means marks that are visible to the human eye, and/or machine readable, and are darker than the surrounding unmarked portions of the substrate. For example, a high-contrast or dark mark may appear on a transparent substrate to be a black, brown, purple, blue, green or other high-contrast, dark or colored mark.

After formation of a coating of the marking composition on the surface of interest, the coating and underlying surface is selectively irradiated with the noted source of energy, which in one embodiment comprises a laser. The term "selective irradiating" refers to directing laser radiation to only particular localized regions of the coating and underlying surface. These regions correspond to the shape and outline of the desired marks. The laser is operated as previously described, i.e. at the noted power levels and speeds. The distance of the laser source from the surface to be marked varies depending upon the focal length of the laser beam. Typically, one or more lenses can be used to focus the laser beam at 1.5, 2, and 4 inches from the surface for example. For many marking applications, a distance of about 1.5 inches between the lens and the surface to be marked is appropriate for a $CO_2$ laser as described herein.

Various types of marks may be produced in accordance with the present subject matter. For example, the marks may comprise alphanumeric symbols, graphics, logos, designs, decorations, serializations, bar codes, two dimensional matrices and the like. In addition, the markings may comprise three-dimensional lines forming patterns suitable for use in plasma display TV screens, fresnel lenses, polarizing filters, conductive circuits and the like.

In accordance with the present subject matter, permanent markings are formed with high contrast and high resolution. Resolution of the mark is determined, at least in part, by the size of the laser beam. Contrast of the mark from the substrate is typically determined, at least in part, by the laser beam energy, make up of the marking composition, and atmosphere in which the laser marking is performed.

Furthermore, by using conventional laser controlled hardware and software, the markings of the present subject matter may be quickly varied from operation to operation for applications such as serialization, bars codes, manufacturing quality control and automated manufacturing.

Evaluations

A series of investigations was conducted in which laser marks formed using inventive laser marking compositions were contrasted with laser marks formed from commercially available comparative marking compositions not including the enhancer. The laser marks formed on various material using the inventive marking compositions and the comparative marking compositions were compared as follows.

Evaluation 1. This evaluation was performed by marking a glass substrate using an inventive laser marking composition Inventive Example 1 comprising 10 wt % FeSi enhancer and LMM6000, which is a commercially available laser marking composition formulated for stainless steel, available from Ferro Corporation, Mayfield Heights, Ohio. The Comparative Example 1 includes the same marking composition as Example 1, but without 10 wt % FeSi enhancer. The laser marks were formed using a universal 35 watt $CO_2$ laser. The laser settings for Inventive Example 1 were 10P/10S, and for Comparative Example 1 were 25P/10S, wherein P=power in watts, and S=speed in inches per minute. The resulting laser markings on glass were evaluated for luminance and color value, and the evaluations are shown below in Table 1.

TABLE 1

| | Marking Composition | | | | | | |
|---|---|---|---|---|---|---|---|
| | L* | a* | b* | DL* | Da* | Db* | DE* |
| Comparative Example 1 | 65.04 | −0.67 | 4.65 | | | | |
| Inventive Example 1 | 31.41 | 0.10 | 0.14 | −33.62 | 0.77 | −4.51 | 33.93 |

As can be seen, even though the LMM6000 marking composition is formulated for marking stainless steel, Example 1 including 10 wt % FeSi enhancer produced a laser mark on glass that was 33.62 units darker (i.e. DL*) versus the laser mark produced by Comparative Example 1 without enhancer.

Evaluation 2. This evaluation was performed by marking a ceramic substrate using Example 1 and Comparative Example 1. The laser marks were formed using a universal 35 watt $CO_2$ laser. The laser settings for Inventive Example 1 were 20P/40S, and for Comparative Example 1 were 20P/5S. The resulting laser markings on ceramic were evaluated for luminance and color value, and the evaluations are shown below in Table 2.

TABLE 2

| | | Marking Composition | | | | | | |
|---|---|---|---|---|---|---|---|---|
| | Strength | L* | a* | b* | DL* | Da* | Db* | DE* |
| Inventive Example 1 | | 51.5 | 0.55 | 4.27 | | | | |
| Comparative Example 1 | 100 | 61.6 | 3.74 | 9.91 | 10.1 | 3.19 | 5.64 | 12 |

As can be seen, Comparative Example 1 without enhancer produced a laser mark on ceramic that was 10.1 units lighter (i.e. DL*) versus the laser mark produced by Inventive Example 1 with the enhancer.

Evaluation 3. This evaluation was performed by marking a glass substrate using an inventive marking composition Inventive Example 2, comprising 10 wt % FeSi enhancer, 5-35 wt % mixed metal oxide pigment, 0.5-10 wt % transition metal oxide, 1-15 wt % silicate mineral, 0.1-5 wt % binder, 35-65 wt % solvent, and 0.02-10 wt % dispersant. The Comparative Example 2 is a commercially available laser marking composition marketed as a "universal" or "all-purpose" laser marking composition. The laser marks were formed using a universal 35 watt $CO_2$ laser. The laser settings for Inventive Example 2 were 10P/25S, and for Comparative Example 2 were 10P/25S. The resulting laser markings on ceramic were evaluated for luminance and color value, and the evaluations are shown below in Table 3.

TABLE 3

| | Marking Composition | | | | | | |
|---|---|---|---|---|---|---|---|
| | L* | a* | b* | DL* | Da* | Db* | DE* |
| Inventive Example 2 | 29.11 | 0.44 | 1.79 | | | | |
| Comparative Example 2 | 36.56 | 0.24 | 5.70 | 7.45 | −0.20 | 3.92 | 8.42 |

As can be seen, Comparative Example 2 produced a laser mark on glass that was 7.45 units lighter (i.e. DL*) versus Inventive Example 2.

Evaluation 4. This evaluation was performed by marking a ceramic substrate using Inventive Example 2 and Comparative Example 2. The laser marks were formed using a universal 35 watt $CO_2$ laser. The laser settings for Inventive Example 2 were 10P/15S, and for Comparative Example 2 were 10P/15S. The resulting laser markings on ceramic were evaluated for luminance and color value, and the evaluations are shown below in Table 4.

TABLE 4

| | Marking Composition | | | | | | |
|---|---|---|---|---|---|---|---|
| | L* | a* | b* | DL* | Da* | Db* | DE* |
| Inventive Example 2 | 34.18 | 0.73 | 3.63 | | | | |
| Comparative Example 2 | 42.69 | 3.69 | 3.39 | 8.51 | 2.96 | −0.25 | 9.02 |

As can be seen, Comparative Example 2 without the enhancer produced a laser mark on ceramic that was 8.51 units lighter (i.e. DL*) versus the laser mark produced by Inventive Example 1 with the enhancer.

Evaluation 5. This evaluation was performed by marking a ceramic substrate using Inventive Example 2 and Comparative Example 2. The laser marks were formed using a universal 35 watt $CO_2$ laser. The laser settings for Inventive Example 2 were 15P/25S, and for Comparative Example 2 were 15P/25S. The resulting laser markings on ceramic were evaluated for luminance and color value, and the evaluations are shown below in Table 5.

TABLE 5

| | Marking Composition | | | | | | |
|---|---|---|---|---|---|---|---|
| | L* | a* | b* | DL* | Da* | Db* | DE* |
| Inventive Example 2 | 23.92 | 0.80 | 1.70 | | | | |
| Comparative Example 2 | 37.38 | 3.08 | 5.77 | 13.46 | 2.28 | 4.07 | 14.25 |

As can be seen, Comparative Example 2 without the enhancer produced a laser mark on ceramic that was 13.46 units lighter (i.e. DL*) versus the laser mark produced by Inventive Example 1 with the enhancer.

Evaluation 6. This evaluation was performed by marking an anodized aluminum substrate using Inventive Example 2 and Comparative Example 2. The laser marks were formed using a universal 35 watt $CO_2$ laser. The laser settings for Inventive Example 2 were 100P/10S, and for Comparative Example 2 were 100P/5S. The resulting laser markings on anodized aluminum were evaluated for luminance and color value, and the evaluations are shown below in Table 6.

TABLE 6

| Marking Composition | L* | a* | b* | DL* | Da* | Db* | DE* |
|---|---|---|---|---|---|---|---|
| Inventive Example 2 | 36.66 | 1.62 | 5.36 | | | | |
| Comparative Example 2 | 50.48 | 2.26 | 12.37 | 13.82 | 0.65 | 7.02 | 15.51 |

As can be seen, Comparative Example 2 without the enhancer produced a laser mark on ceramic that was 13.82 units lighter (i.e. DL*) versus the laser mark produced by Inventive Example 1 with the enhancer.

Evaluation 7. This evaluation involved the use of an inventive laser marking composition, Inventive Example 3, including 5-15 wt % enhancer (either FeSi, SiC, FeMn), 20-25 wt % CoCrMnFe MMO pigment, 5-10 wt % mica silicate mineral, 3-8 wt % $MoO_3$ transition metal oxide, 1-3 wt % hydroxypropyl cellulose binder, 45-55 wt % ethanol solvent, and 2-5 wt % dispersant in the form of equal parts Anti Terra 204 and DISPERSBYK 182.

A Comparative Example 3 laser marking composition was used and comprised commercially available laser marking compositions marketed as "universal" or "all-purpose" laser marking compositions, including in aerosol form comprising 15-40 wt % ethanol, 15-40 wt % acetone, 10-30 wt % propane, 5-10 wt % butane; 1-5 wt % molybdenum, 1-5 wt % crystalline silica, 1-5 wt % ethylene glycol butyl ether, and 0.1-1 wt % methyl isobutyl ketone; and in paste form comprising 50-55 wt % water, 9-11 wt % molybdenum trioxide, 12-14 wt % of a mixture containing 3-5 wt % quartz, 5-7 wt % pyrophyllite, 3-5 wt % mica, and 1-1.5 wt % kaolin clay.

The substrates marked including ceramic, glass, slate, anodized aluminum, aluminum, brass, stainless steel, thermoplastic polyurethane (TPU) polymer.

As shown in FIG. 1, proceeding clockwise from the upper left, a slate substrate, a ceramic substrate, and a glass substrate were marked with Inventive Example 3 including 5-15 wt % FeSi enhancer under various laser operation parameters.

Figure 2:
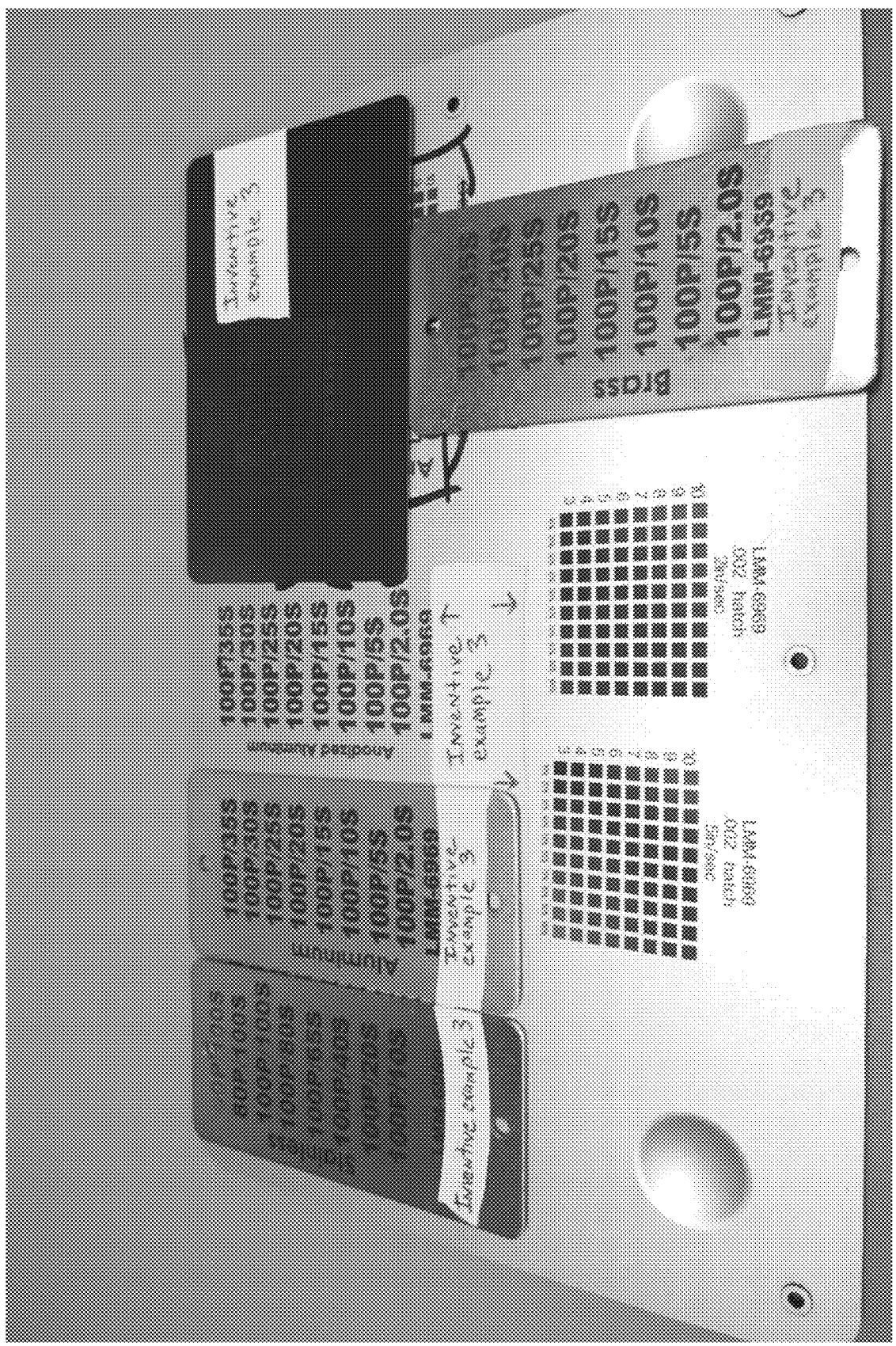
FIG. 2 is a photograph of several other substrates laser marked with a marking composition in accordance with the present subject matter.

As shown in FIG. 2, proceeding clockwise from the upper left, a stainless steel substrate, an aluminum substrate, an anodized aluminum substrate, a red dyed anodized aluminum, a brass substrate, an anodized aluminum substrate, and an anodized aluminum substrate, were marked with Inventive Example 3 including 5-15 wt % FeSi enhancer under various laser operation parameters.

Figure 3:
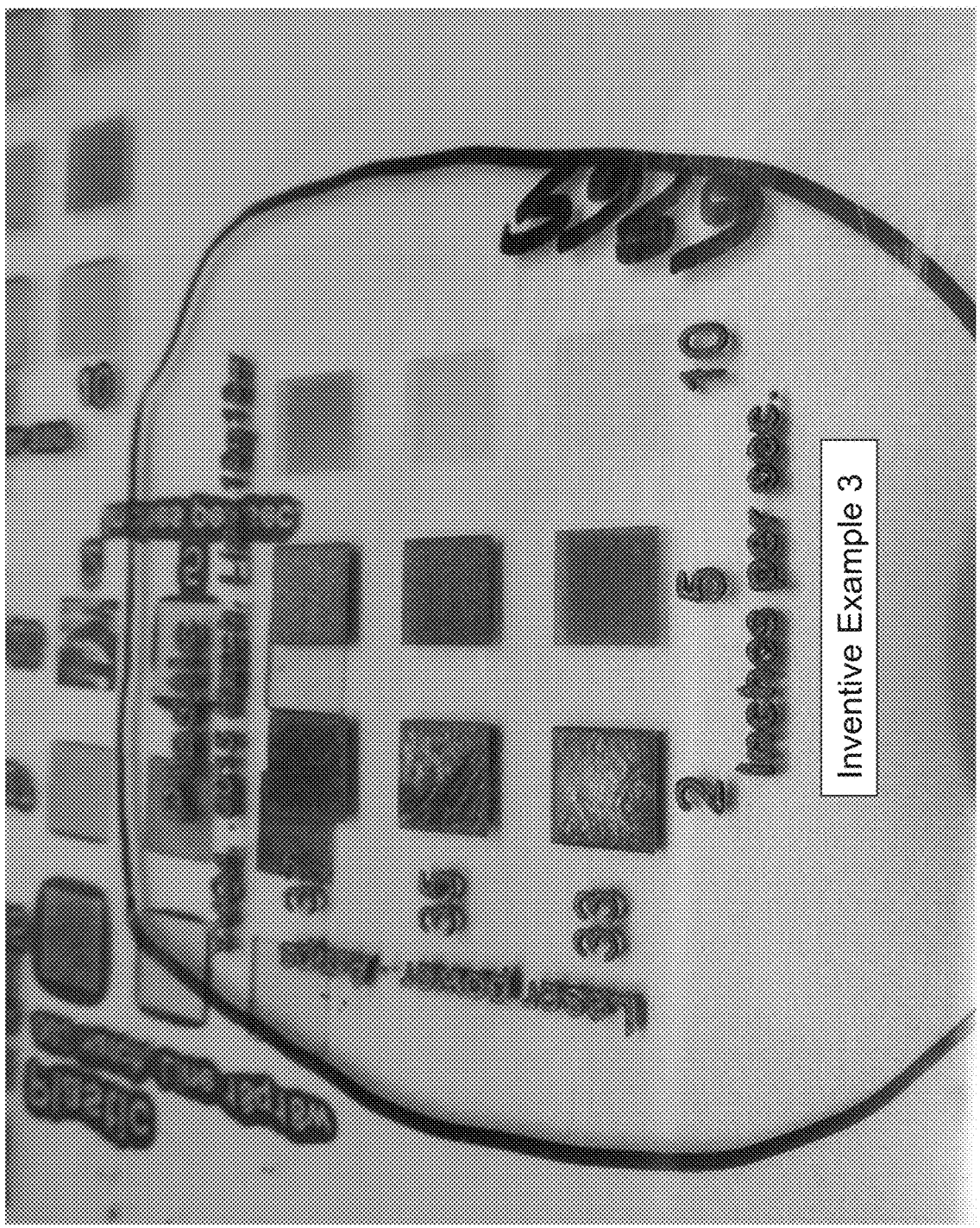
FIG. 3 is a photograph of a plastic substrate laser marked with a marking composition in accordance with the present subject matter.

As shown in FIG. 3, a polycarbonate plastic substrate was marked with Inventive Example 3 including 5-15 wt % FeSi enhancer under various laser operation parameters.

Figure 4:
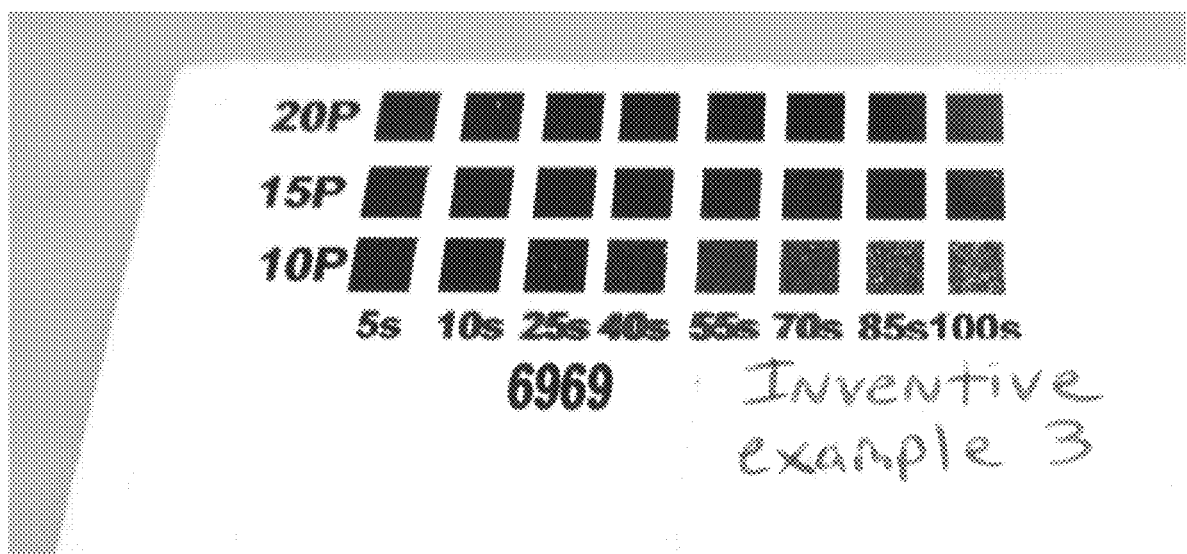
FIG. 4 is a photograph of a ceramic substrate laser marked with a marking composition in accordance with the present subject matter, and another ceramic substrate marked with a comparative example marking composition.
Figure 4:
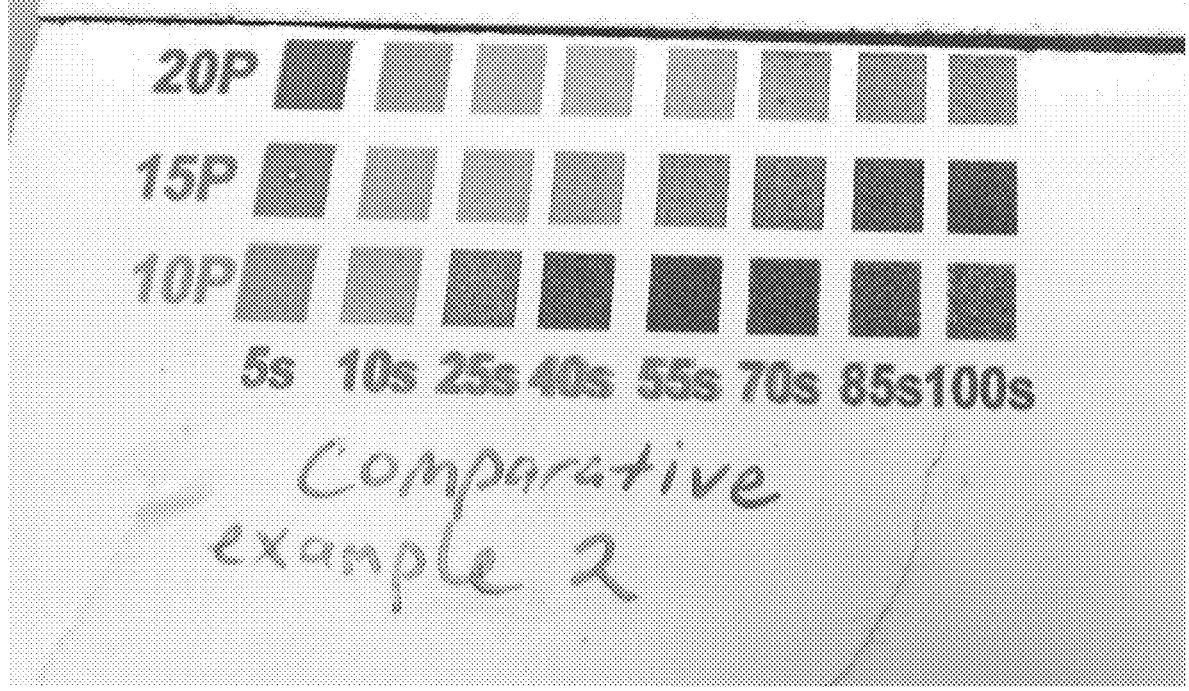

As shown in FIG. 4, the top ceramic substrate was marked with Inventive Example 3 including 5-15 wt % FeSi enhancer under various laser operation parameters, and the bottom ceramic substrate was marked with the Comparative Example 3 under various laser operation parameters. As can be seen, under the same laser operation parameters, Inventive Example 3 including 5-15 wt % FeSi enhancer produced darker, more contrasting marks than Comparative Example 3 not including the enhancer.

In particular, the following tables shows data from the markings depicted in FIG. 4. The inventive marks (top) and the comparative marks (bottom) were prepared using a Universal 35 watt laser, and the inventive marks were compared to the darkest comparative marks (i.e. those with the highest contrast), which were attained at 10, 15, 20 power. This comparison provides a greater latitude between the marking capabilities of the Inventive Example 3 versus the Comparative Example 3.

The Delta L in Table 7 is the darkness value at a laser power of 10 and a speeds of 15/20/25. As seen, the enhanced Inventive Example 3 exhibits a darker, more contrasting mark by an average of 11.1 units darker versus Comparative Example 3.

TABLE 7

| Example | Laser Power/ Speed | L* | a* | b* | DL* | Da* | Db* | DE* |
|---|---|---|---|---|---|---|---|---|
| Comparative Example 3 | 10/15 | 42.96 | 1.99 | 3.62 | | | | |
| Inventive Example 3 | 10/15 | 28.35 | 0.33 | 1.89 | −14.61 | −1.66 | −1.74 | 14.81 |
| Comparative Example 3 | 10/20 | 43.44 | 1.12 | 4.84 | | | | |
| Inventive Example 3 | 10/20 | 32.71 | 0.52 | 2.89 | −10.72 | −0.6 | −1.95 | 10.91 |
| Comparative Example 3 | 10/25 | 41.97 | 1.09 | 6.22 | | | | |
| Inventive Example 3 | 10/25 | 33.96 | 0.36 | 3.52 | −8.01 | −0.73 | −2.7 | 8.48 |

The Delta L in Table 8 is the darkness value at a laser power of 15 and a speeds of 30/35/40. As seen, the enhanced Inventive Example 3 exhibits a darker, more contrasting mark by an average of 12.7 units darker versus Comparative Example 3.

TABLE 8

| Example | Laser Power/ Speed | L* | a* | b* | DL* | Da* | Db* | DE* |
|---|---|---|---|---|---|---|---|---|
| Comparative Example 3 | 15/30 | 42.81 | 2.42 | 2.95 | | | | |
| Inventive Example 3 | 15/30 | 28.24 | 0.5 | 2.58 | −14.57 | −1.92 | −0.37 | 14.7 |
| Comparative Example 3 | 15/35 | 43.32 | 1.7 | 3.74 | | | | |
| Inventive Example 3 | 15/35 | 29.54 | 0.6 | 2.93 | −13.78 | −1.1 | −0.81 | 13.85 |
| Comparative Example 3 | 15/40 | 42.05 | 1.14 | 4.88 | | | | |
| Inventive Example 3 | 15/40 | 32.29 | 0.69 | 3.35 | −9.76 | −0.46 | −1.53 | 9.89 |

The Delta L in Table 9 is the darkness value at a laser power of 20 and a speeds of 15/20/25. As seen, the enhanced Inventive Example 3 exhibits a darker, more contrasting mark by an average of 14.2 units darker versus Comparative Example 3.

TABLE 9

| Example | Laser Power/ Speed | L* | a* | b* | DL* | Da* | Db* | DE* |
|---|---|---|---|---|---|---|---|---|
| Comparative Example 3 | 20/15 | 51.6 | 1.98 | 10.59 | | | | |
| Inventive Example 3 | 20/15 | 34.47 | 2 | 7.03 | −17.13 | 0.03 | −3.56 | 17.5 |
| Comparative Example 3 | 20/20 | 46.78 | 4.48 | 7.56 | | | | |
| Inventive Example 3 | 20/20 | 36.58 | 1.84 | 7.51 | −10.2 | −2.65 | −0.05 | 10.54 |
| Comparative Example 3 | 20/25 | 46.69 | 5.98 | 7.22 | | | | |
| Inventive Example 3 | 20/25 | 31.51 | 1.49 | 5.03 | −15.19 | −4.49 | −2.2 | 15.99 |

Figure 5:
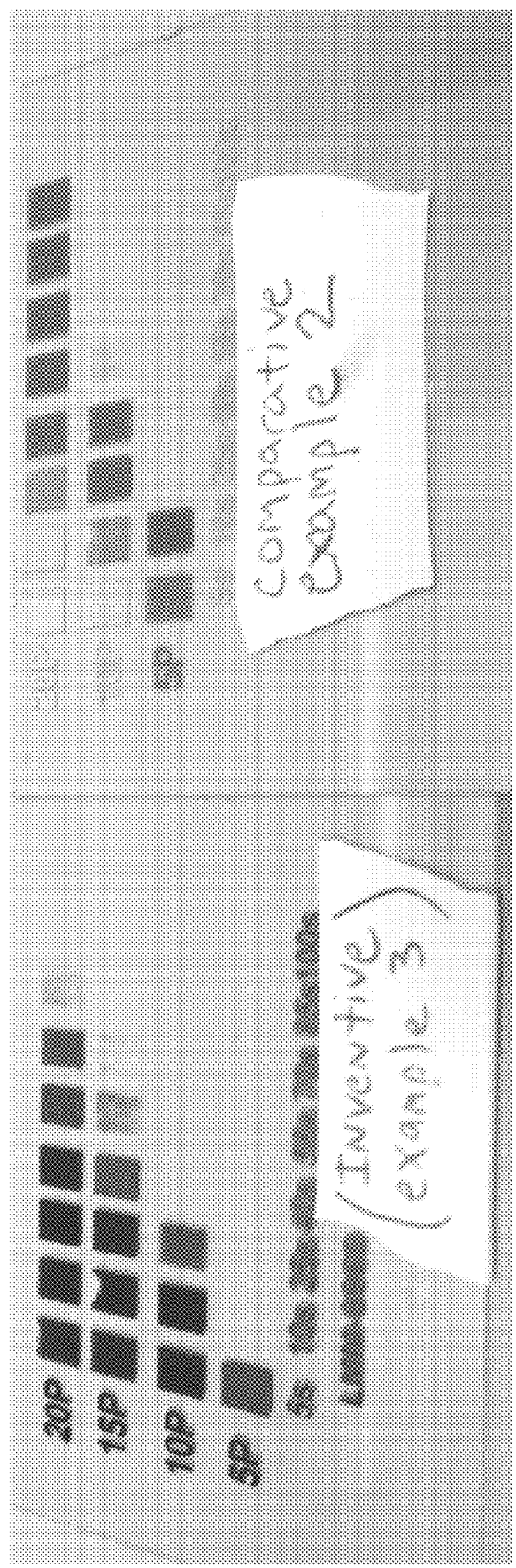
FIG. 5 is a photograph of a glass substrate laser marked with a marking composition in accordance with the present subject matter, and another glass substrate marked with a comparative example marking composition.

As shown in FIG. 5, the left glass substrate was marked with Inventive Example 3 including 5-15 wt % FeSi enhancer under various laser operation parameters, and the right glass substrate was marked with Comparative Example 3 under various laser operation parameters. As can be seen, under the same laser operation parameters, Inventive Example 3 including 5-15 wt % FeSi produced darker, more contrasting marks than Comparative Example 3.

Figure 6:
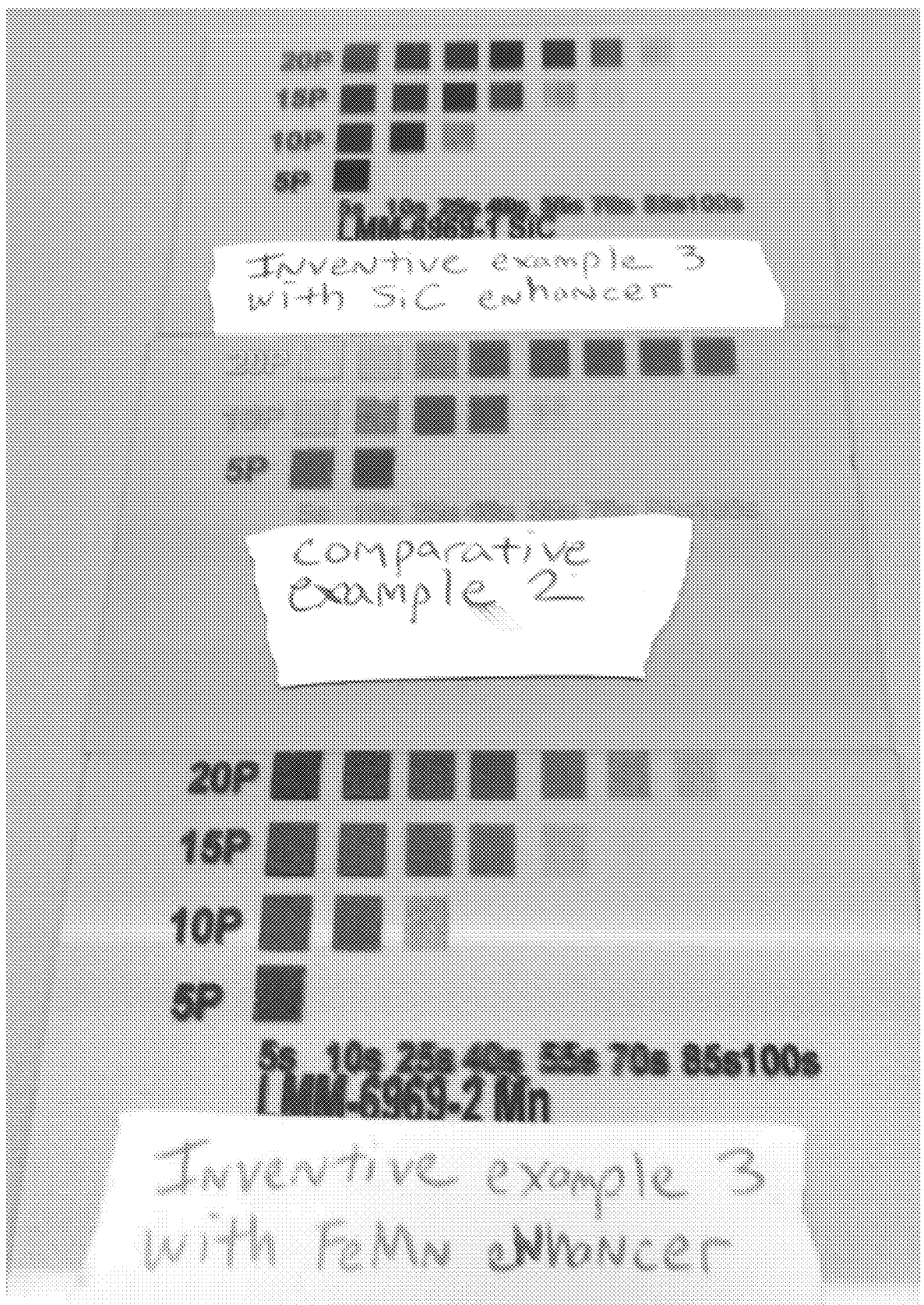
FIG. 6 is a photograph of two glass substrates laser marked with marking compositions in accordance with the present subject matter, and another glass substrate marked with a comparative example marking composition.

As shown in FIG. 6, the top glass substrate was marked with Inventive Example 3 including 5-15 wt % SiC enhancer under various laser operation parameters, the bottom glass substrate was marked with Inventive Example 3 including 5-15 wt % ferrous manganese enhancer under various laser operation parameters, and the middle glass substrate was marked with the comparative marking composition example under various laser operation parameters. As can be seen, under the same laser operation parameters, Inventive Example 3 including either. SiC or Ferrous manganese enhancers produced darker, more contrasting marks than Comparative Example 3 not including an enhancer.

Figure 7:
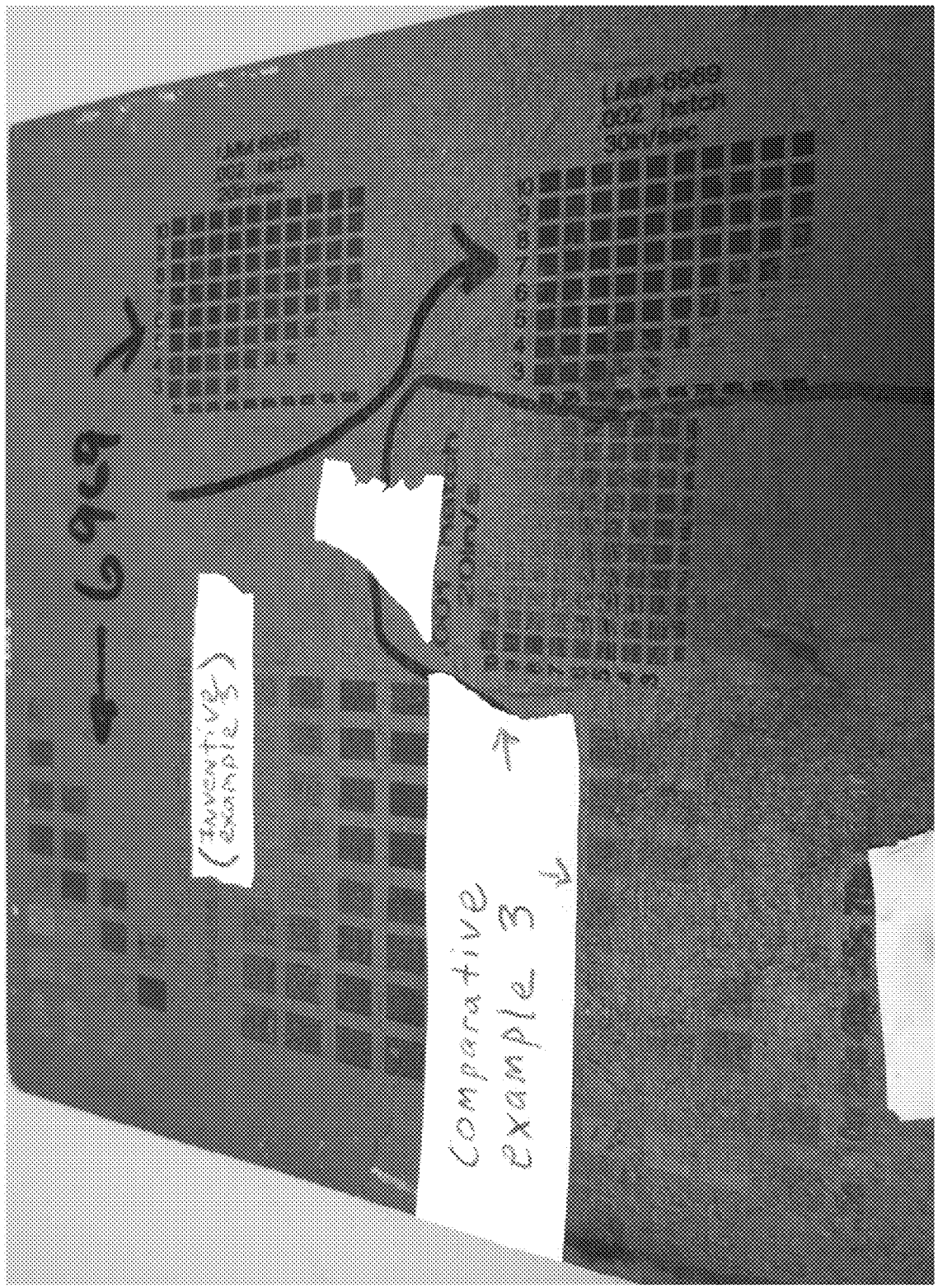
FIG. 7 is a photograph of a slate substrate laser marked with a marking composition in accordance with the present subject matter and marked with a comparative example marking composition.

As shown in FIG. 7, the slate substrate was marked with Inventive Example 3 including 5-15 wt % FeSi enhancer as indicated under various laser operation parameters, and the same slate substrate was marked as indicated with the Comparative Example 3 under various laser operation parameters. As can be seen, under the same laser operation parameters, Inventive Example 3 including 5-15 wt % FeSi produced darker, more contrasting marks than Comparative Example 3 not including enhancers.

Figure 8:
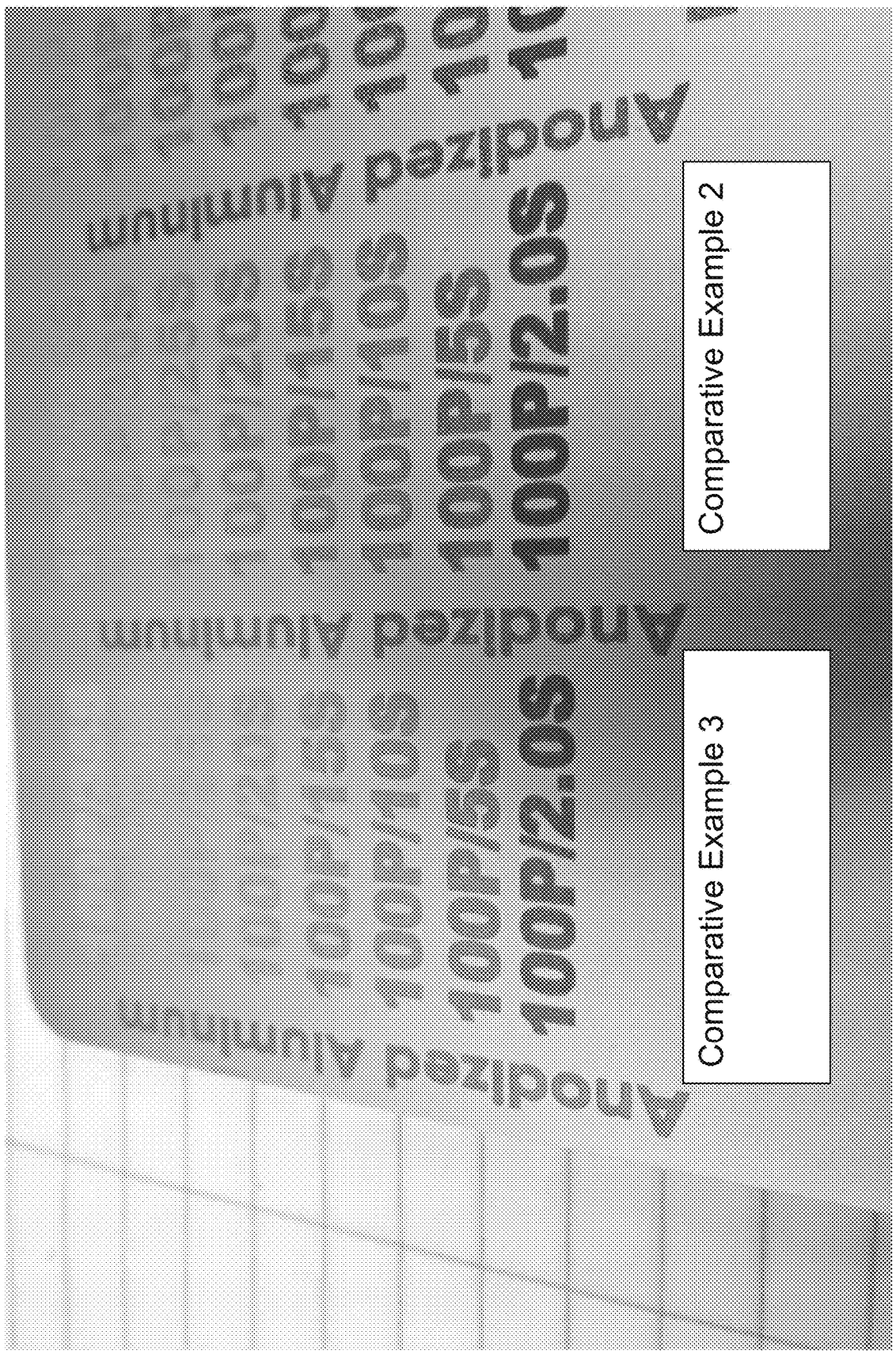
FIG. 8 is a photograph of an anodized aluminum substrate laser marked with a comparative example marking composition.
Figure 9:
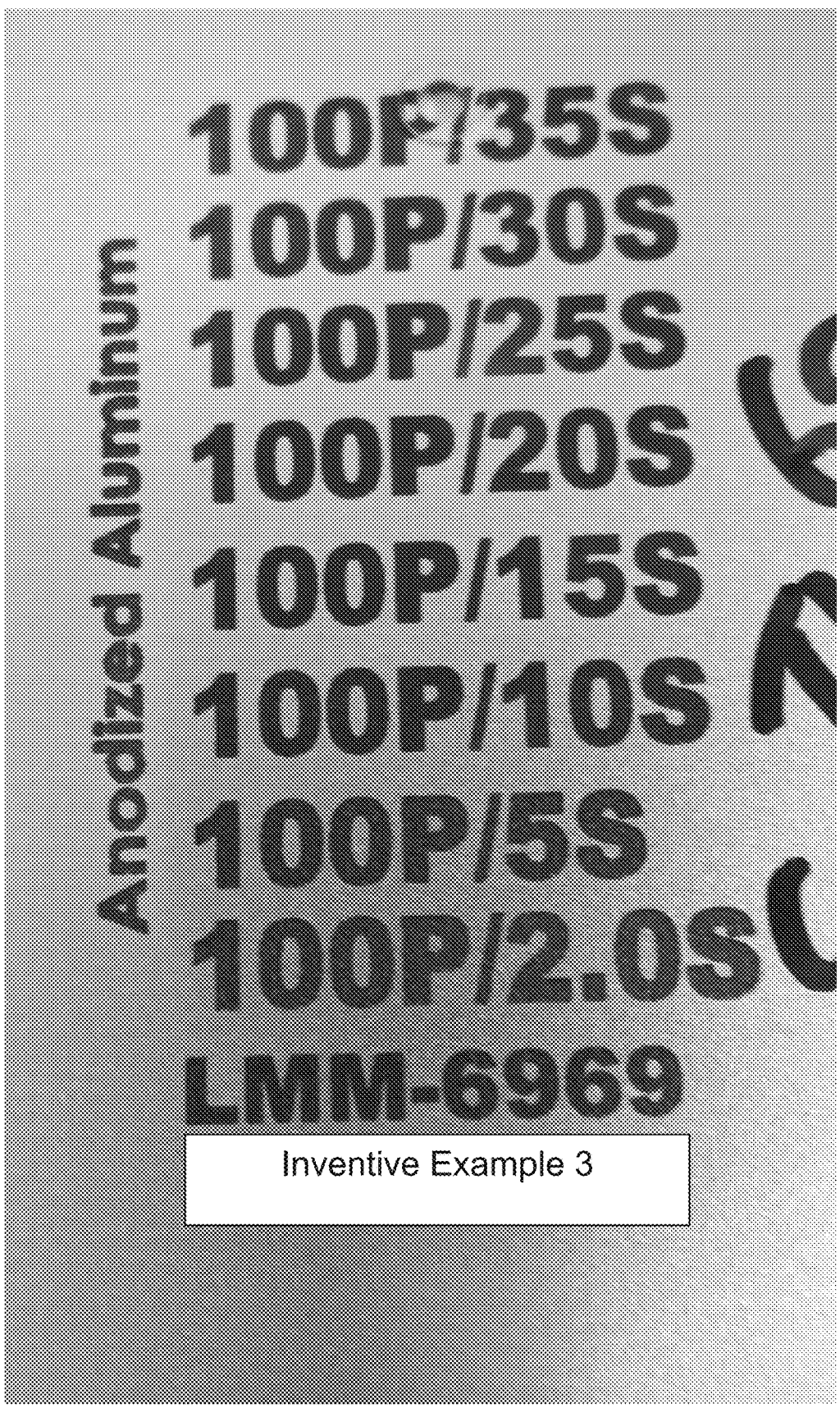
FIG. 9 is a photograph of an anodized aluminum substrate laser marked with a marking composition in accordance with the present subject matter.

As shown in FIG. 8, the anodized aluminum substrate was marked with Comparative Example 3 example under various laser operation parameters. As shown in FIG. 9, the anodized aluminum substrate was marked with Inventive Example 3 including 5-15 wt % FeSi enhancer as indicated under various laser operation parameters. As can be seen between FIGS. 8 and 9, under the same laser operation parameters, Inventive Example 3 including 5-15 wt % FeSi enhancer produced a mark as dark as, if not darker, than Comparative Example 3 not including enhancers.

Figure 10:
FIG. 10 is a photograph of an aluminum substrate laser marked with a marking composition in accordance with the present subject matter, and another aluminum substrate marked with a comparative example marking composition.

As shown in FIG. 10, the left aluminum substrate was marked with Inventive Example 3 including 5-15 wt % FeSi enhancer under various laser operation parameters, and the right aluminum substrate was marked with the Comparative Example 3 under various laser operation parameters. As can be seen, under the same laser operation parameters, Inventive Example 3 including 5-15 wt % FeSi enhancer produced as dark, if not darker, marks than the Comparative Example 3 not including enhancer.

Figure 11:
FIG. 11 is a photograph of a brass substrate laser marked with a marking composition in accordance with the present subject matter, and another brass substrate marked with a comparative example marking composition.

As shown in FIG. 11, the left brass substrate was marked with Inventive Example 3 including 5-15 wt % FeSi enhancer under various laser operation parameters, and the right brass substrate was marked with the Comparative Example 3 under various laser operation parameters. As can be seen, under the same laser operation parameters, the Inventive Example 3 including 5-15 wt % FeSi enhancer produced as dark, if not darker, marks than Comparative Example 3 not including enhancers.

Figure 12:
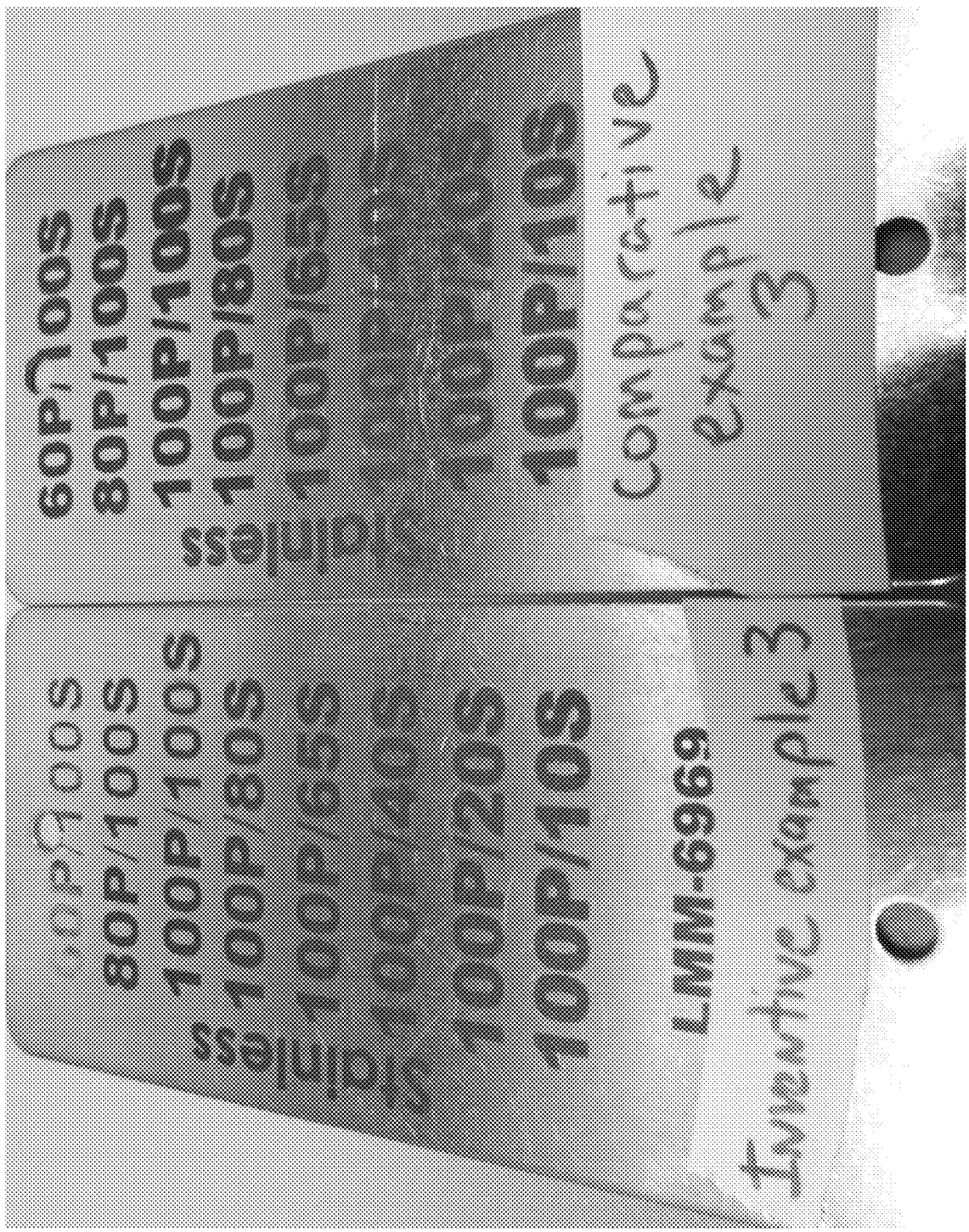
FIG. 12 is a photograph of a stainless steel substrate laser marked with a marking composition in accordance with the present subject matter, and another stainless steel substrate marked with a comparative example marking composition.

As shown in FIG. 12, the left stainless steel substrate was marked with Inventive Example 3 including 5-15 wt % FeSi enhancer under various laser operation parameters, and the right stainless steel substrate was marked with the Comparative Example 3 under various laser operation parameters. As can be seen, under the same laser operation parameters, Inventive Example 3 including 5-15 wt % enhancer produced as dark, if not darker, marks than the Comparative Example 3 not including enhancers.

Figure 13:
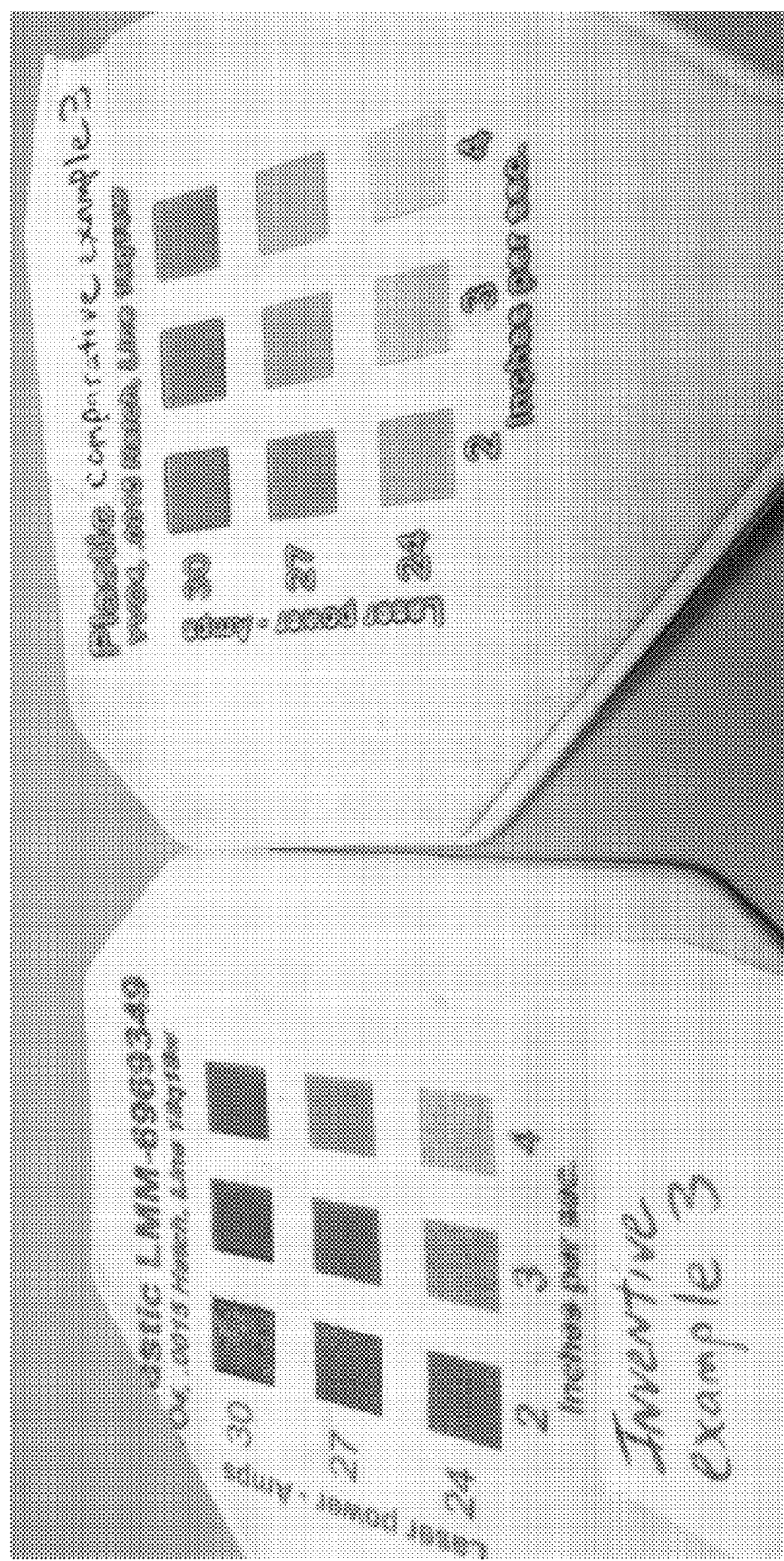
FIG. 13 is a photograph of a plastic substrate laser marked with a marking composition in accordance with the present subject matter, and another plastic substrate marked with a comparative example marking composition.

As shown in FIG. 13, the left TPU polymer substrate was marked with Inventive Example 3 including 5-15 wt % FeSi enhancer under various laser operation parameters, and the right TPU polymer substrate was marked with the Comparative Example 3 under various laser operation parameters. As can be seen, under the same laser operation parameters, Inventive Example 3 including 5-15 wt % enhancer produced darker, more defined marks than the Comparative Example 3 not including enhancers.

Figure 14:
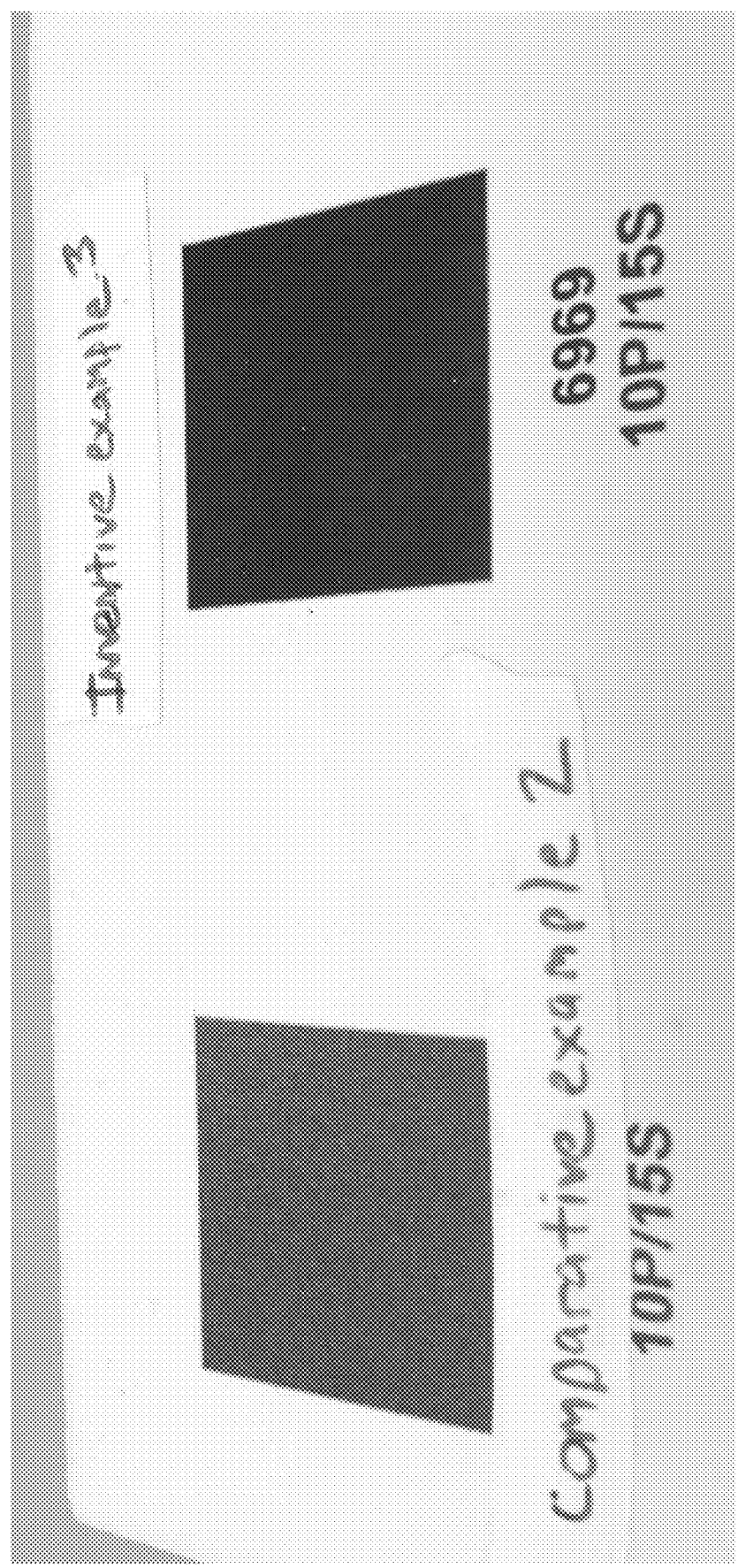
FIG. 14 is a photograph of a ceramic substrate laser marked with a marking composition in accordance with the present subject matter, and marked with a comparative example marking composition.
Figure 15:
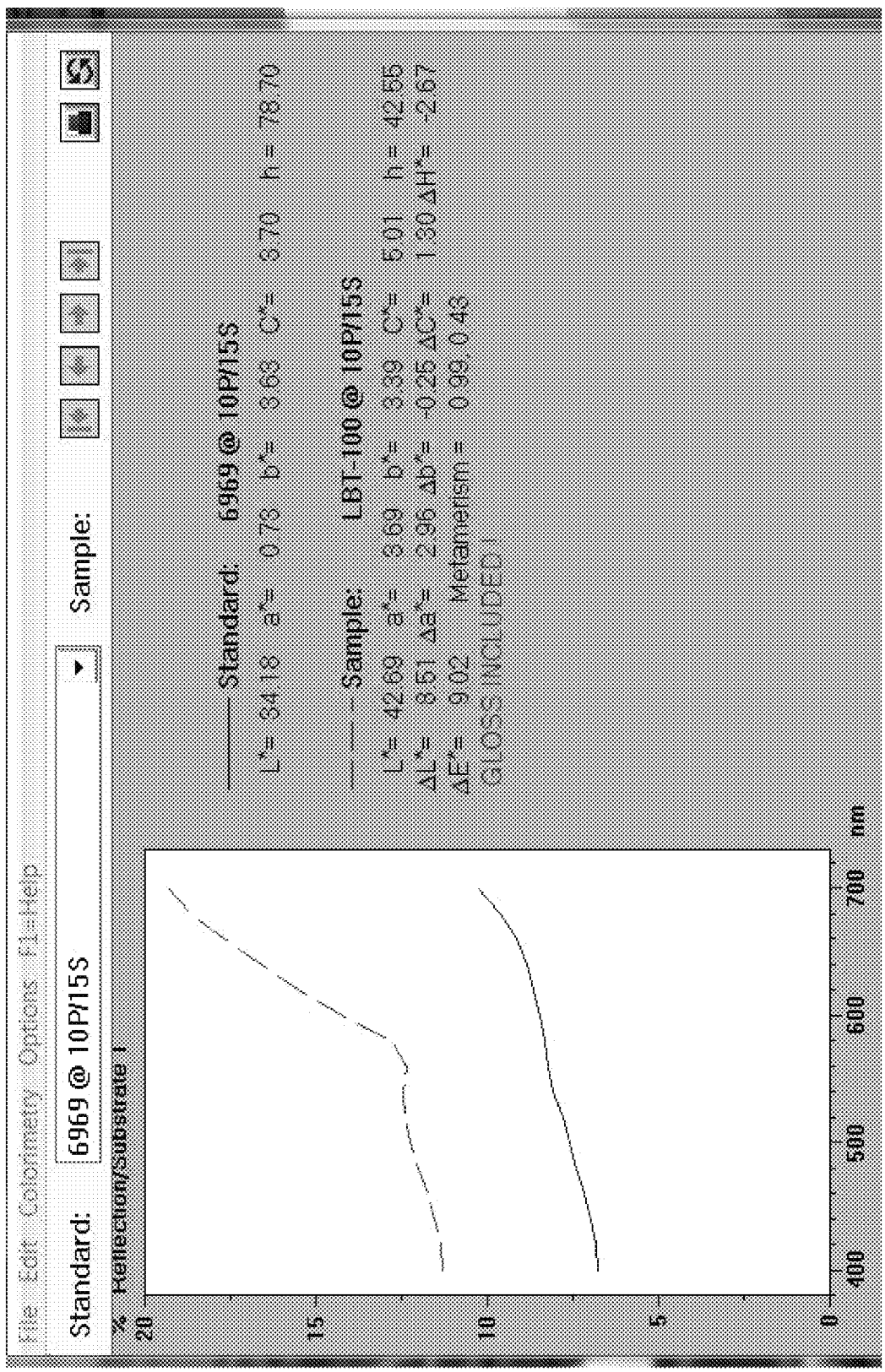
FIG. 15 is a screen shot of a colorimetry analysis of the markings of FIG. 14.

As shown in FIG. 14, the left ceramic polymer substrate was marked with Inventive Example 3 including 5-15 wt % FeSi enhancer at a select laser operation parameter, and the right ceramic substrate was marked with the Comparative Example 3 under the same laser operation parameter. As can be seen, under the same laser operation parameter, Inventive Example 3 including enhancer produced a darker, more defined mark than the Comparative Example 3 not including enhancers. As shown in FIG. 15, when subject to a colorimetry analysis, the mark made using Inventive Example 3 was darker than the Comparative Example mark by $-8.5\ \Delta L$ units. The spectrophotometer being used to produce FIG. 15 was a Datacolor 600 spectrophotometer, and the software used was CGREC, Version 2.10.

As will be appreciated, the inventive marking compositions provide improved markings on a variety of substrates over the marking compositions of the comparative examples, and therefore the inventive marking compositions truly are universal or all-purpose marking compositions that can provide improved laser marks on a variety of substrates as compared to conventional marking compositions, which provide satisfactory marks on only a limited number of substrates (e.g. metal) and therefore cannot be considered universal or all-purpose marking compositions.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A marking composition for forming marks or indicia on a substrate upon laser irradiation, the marking composition comprising:
   2-20 wt %® of an enhancer selected from the group consisting of nitrides, carbides, silicides, and combinations thereof,
   5-35 wt % mixed metal oxide pigment,
   0.5-10 wt % transition metal oxide,
   1-15 wt % silicate mineral,
   0.1-5 wt % binder,
   35-65 wt % solvent, and
   0.02-10 wt % dispersant;
   wherein:
   upon disposing the marking composition on a substrate and exposing the marking composition to laser radiation, the marking composition absorbs the laser radiation, increases in temperature, chemically bonds with the substrate, and forms a fused mark on the substrate having a luminance, color value, or degrees of opacity that provides visual contrast with the substrate,
   when formed on each of a metal, glass, ceramic, stone, and plastic substrates, the mark has a negative $\Delta L$ dark contrast value of at least $-1$ compared to a mark formed by the marking composition without the enhancer,
   the enhancer is selected from the group consisting of ferrosilicon, $Fe_xSi_{(1-x)}$ where X can range from about 0.005 to 0.995, $Fe_5Si_2$, MgFeSi, CaSi, $MoSi_2$, $TiSi_2$, $ZrSi_2$, $WSi_2$, $MnSi_2$, YSi, $Cu_5Si$, $Ni_2Si$, $Fe_3C$, $Fe_7C_3$, $Fe_2C$, $YC_2$, $Al_4C_3$, $Mg_2C$, $Mg_2C_3$, $CaC_2$, $LaC_2$, $Ta_4C_3$, MoN, $Mo_2N$, and combinations thereof.

2. The marking composition according to claim 1, wherein the mixed metal oxide pigment includes a cobalt, chromium, manganese and iron mixed metal oxide.

3. The marking composition according to claim 1, wherein the transition metal oxide includes $MoO_3$.

4. The marking composition according to claim 1, wherein silicate mineral includes mica.

5. The marking composition according to claim 1, wherein the binder includes hydroxypropyl cellulose.

6. The marking composition according to claim 1, wherein the solvent includes ethanol.

7. A method of laser marking a substrate, comprising:
   providing a substrate selected from the group consisting of metal, glass, ceramic, stone, and plastic;
   providing a marking composition including an enhancer selected from the group consisting of nitrides, carbides, silicides, and combinations thereof, and
   disposing the marking composition on at least a portion of the substrate; and
   exposing at least a portion of the marking composition to laser radiation such that the irradiated portion of the marking composition absorbs the laser radiation, increases in temperature, chemically bonds with the substrate, and forms a fused mark on the substrate that has a luminance, color, and/or degree of opacity that contrasts from the substrate,
   wherein when formed on each of the metal, glass, ceramic, stone, and plastic substrates, the mark has a negative $\Delta L$ dark contrast value of at least $-1$ compared to a mark formed by the marking composition without the enhancer; and
   wherein the enhancer is selected from the group consisting of ferrosilicon, $Fe_xSi_{(1-x)}$ where X can range from about 0.005 to 0.995, $Fe_5Si_2$, MgFeSi, CaSi, $MoSi_2$, $TiSi_2$, $ZrSi_2$, $WSi_2$, $MnSi_2$, YSi, $Cu_5Si$, $Ni_2Si$, $Fe_3C$, $Fe_7C_3$ and $Fe_2C$, $YC_2$, $Al_4C_3$, $Mg_2C$, $Mg_2C_3$, $CaC_2$, $LaC_2$, $Ta_4C_3$, MoN, $Mo_2N$, and combinations thereof.

8. The method according to claim 7, wherein the enhancer is included at 2-20 wt % of the marking composition.

9. The method according to claim 7, further comprising:
   5-35 wt % mixed metal oxide pigment,
   0.5-10 wt % transition metal oxide,
   1-15 wt % silicate mineral,
   0.1-5 wt % binder, 35-65 wt % solvent, and
0.02-10 wt % dispersant.

10. The method according to claim 9, wherein the mixed metal oxide pigment includes a cobalt, chromium, manganese and iron mixed metal oxide.

11. The method according to claim 9, wherein the transition metal oxide includes $MoO_3$.

12. The method according to claim 9, wherein silicate mineral includes mica.

13. The method according to claim 9, wherein the binder includes hydroxypropyl cellulose.

14. The method according to claim 9, wherein the solvent includes ethanol.

* * * * *